United States Patent
He et al.

(10) Patent No.: US 12,401,449 B2
(45) Date of Patent: Aug. 26, 2025

(54) DATA TRANSMISSION METHOD, APPARATUS, DEVICE, SYSTEM, AND READABLE STORAGE MEDIUM

(71) Applicant: HUAWEI TECHNOLOGIES CO., LTD., Guangdong (CN)

(72) Inventors: Xiang He, Beijing (CN); Hao Ren, Beijing (CN); Xinyuan Wang, Beijing (CN); Jing Tian, Nanjing (CN); Zhongfeng Wang, Nanjing (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 13 days.

(21) Appl. No.: 18/436,986

(22) Filed: Feb. 8, 2024

(65) Prior Publication Data

US 2024/0187130 A1  Jun. 6, 2024

Related U.S. Application Data

(63) Continuation of application No. PCT/CN2022/077208, filed on Feb. 22, 2022.

(30) Foreign Application Priority Data

Aug. 11, 2021 (CN) .......... 202110920833.X
Sep. 1, 2021 (CN) .......... 202111022657.4

(51) Int. Cl.
  H04L 1/00      (2006.01)
(52) U.S. Cl.
  CPC .......... H04L 1/0041 (2013.01); H04L 1/0057 (2013.01); H04L 1/0071 (2013.01)
(58) Field of Classification Search
  CPC ..... H04L 1/004; H04L 1/0041; H04L 1/0057; H04L 1/0071; H04L 1/0075
  See application file for complete search history.

(56) References Cited

U.S. PATENT DOCUMENTS 8,982,915 B1 * 3/2015 Lo .......... H04L 25/14
                                        398/58
9,948,426 B2 * 4/2018 Baek .......... H04L 27/36
(Continued)

FOREIGN PATENT DOCUMENTS

CN    1489308 A    4/2004
CN    1490947 A    4/2004
(Continued)

OTHER PUBLICATIONS

IEEE Computer Society:"IEEE Standard for Ethernet Amendment 10: Media Access Control Parameters, Physical Layers, and Management Parameters for 200 GB/s and 400 GB/s Operation." IEEE 3 Park Avenue New York, NY 10016-5997. IEEE Std 802.3bs™-2017. total 372 pages.

(Continued)

Primary Examiner — Shelly A Chase
(74) Attorney, Agent, or Firm — WOMBLE BOND DICKINSON (US) LLP

(57) ABSTRACT

Embodiments of this application disclose a data transmission method, an apparatus, a device, a system, and a readable storage medium. The data transmission method includes: A first module obtains first data, where the first data is data that is encoded by using a first FEC code type and on which first processing is performed, and the first processing includes interleaving processing. The first module encodes the first data based on a second FEC code type, to obtain a plurality of second codewords. The first module performs second processing on the plurality of second codewords, to obtain second data. The first module transmits the second data.

28 Claims, 15 Drawing Sheets

(56) References Cited

U.S. PATENT DOCUMENTS

| | | | |
|---|---|---|---|
| 2003/0106009 A1 | 6/2003 | Jarchi et al. | |
| 2015/0039966 A1* | 2/2015 | Fonseka | H03M 13/2742 |
| | | | 714/752 |
| 2015/0162937 A1 | 6/2015 | Zhang et al. | |
| 2020/0153548 A1 | 5/2020 | Lusted | |
| 2021/0184700 A1* | 6/2021 | Tu | H03M 13/2792 |

FOREIGN PATENT DOCUMENTS

| | | |
|---|---|---|
| CN | 1491032 A | 4/2004 |
| CN | 101013931 A | 8/2007 |
| CN | 104115435 A | 10/2014 |
| CN | 208956063 U | 6/2019 |
| CN | 110999094 A | 4/2020 |
| EP | 4228160 A1 | 8/2023 |
| WO | 2020227976 A1 | 11/2020 |
| WO | 2020228126 A1 | 11/2020 |

OTHER PUBLICATIONS

ITU-T G.709.3/Y.1331.3:"Flexible OTN long-reach interfaces." (Dec. 2020). total 118 pages.

ITU-T G.975:"Forward error correction for submarine systems." (Oct. 2000). total 21 pages.

IEEE Computer Society:"IEEE Standard for Ethernet Amendment 13: Physical Layers and Management Parameters for 100 GB/s Operation over DWDM Systems." IEEE Std 802.3ct™-2021. Jun. 2021. total 133 pages.

Xiang He et al:"FEC Architecture of B400GbE to Support BER Objective." May 2021. total 19 pages.

\* cited by examiner

DATA TRANSMISSION METHOD, APPARATUS, DEVICE, SYSTEM, AND READABLE STORAGE MEDIUM

CROSS-REFERENCE TO RELATED APPLICATIONS

This application is a continuation of International Application No. PCT/CN2022/077208, filed on Feb. 22, 2022, which claims priority to Chinese Patent Application No. 202110920833.X, filed on Aug. 11, 2021 and to Chinese Application No. 202111022657.4, filed on Sep. 1, 2021. All of the aforementioned patent applications are hereby incorporated by reference in their entireties.

TECHNICAL FIELD

Embodiments of this application relate to the field of communication technologies, and in particular, to a data transmission method, an apparatus, a device, a system, and a readable storage medium.

BACKGROUND

With the increase of a data transmission rate, channel loss and noise limit a data transmission rate and distance. Forward error correction (FEC) coding is more widely used as a data encoding method that can provide parity bits for transferred data and improve a data transmission rate and transmission distance on a channel. In a data transmission process, a transmitting end encodes original data based on a specific FEC code type, and sends encoded data to a receiving end. The receiving end decodes the received data by using the same FEC code type, to obtain the original data.

SUMMARY

This application provides a data transmission method, an apparatus, a device, a system, and a readable storage medium, to improve data transmission quality.

According to a first aspect, a data transmission method is provided. The method includes: A first module obtains first data, where the first data is data that is encoded by using a first forward error correction FEC code type and on which first processing is performed, and the first processing includes interleaving processing. The first module encodes the first data based on a second FEC code type, to obtain a plurality of second codewords. The first module performs second processing on the plurality of second codewords, to obtain second data. The first module transmits the second data.

In the method, concatenated encoding can enable transmitted data to have a higher coding gain. During transmission on a lane prone to a bit error, effective error correction can be performed on data in which a bit error occurs. In addition, because the first data is data obtained through the interleaving processing, a correlation of error bits in a codeword obtained through second FEC code correction can be eliminated, thereby improving error correction performance and further improving data transmission quality.

In an embodiment, the second processing includes inserting at least one of a training sequence and a pilot symbol required by a coherent link. The at least one of the training sequence and the pilot symbol required by the coherent link is inserted, so that the method may be applied to the coherent link.

In an embodiment, at least one of the first processing and the second processing further includes inserting data that is for frequency adjustment. The data for frequency adjustment is inserted, so that the frequency of processed data can meet a requirement.

In an embodiment, that a first module obtains first data includes: The first module receives a plurality of pieces of first subdata sent by a second module, where the plurality of pieces of first subdata are data that is encoded by using the first FEC code type and that is distributed through a physical medium attachment PMA sublayer. The first module aligns the plurality of pieces of first subdata to obtain a plurality of first codewords. The first module performs interleaving processing on the plurality of first codewords to obtain the first data. The interleaving processing is performed on the plurality of first codewords, so that a correlation of error bits in a codeword that is subsequently encoded by using the second FEC code type can be eliminated, thereby improving error correction performance.

In an embodiment, that the first module obtains the first data includes: The first module receives a plurality of pieces of first subdata sent by a second module, where the plurality of pieces of first subdata are data that is encoded by using the first FEC code type, on which interleaving processing is performed, that is distributed through a physical medium attachment PMA sublayer. The first module aligns the plurality of pieces of first subdata to obtain a plurality of first codewords. The first module performs interleaving processing on the plurality of first codewords to obtain the first data. When the interleaving processing is performed on the first subdata, the interleaving processing is also subsequently performed on the plurality of first codewords, so that a correlation of error bits in a codeword that is subsequently encoded by using the second FEC code type can be further eliminated, thereby improving error correction performance.

In an embodiment, that the first module aligns the plurality of pieces of first subdata to obtain a plurality of first codewords includes: The first module aligns the plurality of pieces of first subdata, de-interleaves the aligned data, and obtains the plurality of first codewords based on a result of the de-interleaving. Alternatively, the first module aligns the plurality of pieces of first subdata, and uses the aligned data as the plurality of first codewords. In a case of no de-interleaving, the aligned data is directly used as the plurality of first codewords, so that a data transmission speed can be improved.

In an embodiment, that the first module obtains the first data includes: The first module receives a plurality of pieces of first subdata sent by a second module, where the plurality of pieces of first subdata are data that is encoded by using the first FEC code type, on which interleaving processing is performed, and that is distributed through a physical medium attachment PMA sublayer. The first module aligns the plurality of pieces of first subdata to obtain the first data. Because the plurality of pieces of first subdata are data that is encoded by using the first FEC code type, on which the interleaving processing is performed, and that is distributed through the PMA sublayer, when the plurality of pieces of first subdata are aligned to obtain the first data, a delay and power consumption can be further reduced.

In an embodiment, the first module is located on a first chip, the second module is located on a second chip, and that the first module receives a plurality of pieces of first subdata sent by a second module includes: The first module receives the plurality of pieces of first subdata that are sent by the second module through a plurality of lanes of an attachment unit interface AUI.

In an embodiment, the first module is located on a first chip, and that the first module obtains the first data includes: The first module receives a plurality of pieces of first subdata that are sent by a second module through one lane of an attachment unit interface AUI, where the second module is located on a second chip, and the plurality of pieces of first subdata are data that is encoded by using the first FEC code type and that is distributed through a physical medium attachment PMA sublayer, or the plurality of pieces of first subdata are data that is encoded by using the first FEC code type, on which interleaving processing is performed, and that is distributed through a physical medium attachment PMA sublayer. The first module performs alignment marker AM lock on the plurality of pieces of first subdata to obtain a plurality of first codewords. The first module performs interleaving processing on the plurality of first codewords, to obtain the first data.

In an embodiment, the plurality of pieces of first subdata are data that is encoded by using the first FEC code type, on which interleaving processing is performed, and that is distributed through a physical medium attachment PMA sublayer, and that the first module performs alignment marker AM lock on the plurality of pieces of first subdata to obtain a plurality of first codewords includes: The first module performs AM lock on the plurality of pieces of first subdata, and performs de-interleaving on AM locked data, to obtain the plurality of first codewords based on a result of the de-interleaving. Alternatively, the first module performs AM lock on the plurality of pieces of first subdata, and uses AM locked data as the plurality of first codewords.

In an embodiment, the first module is located on a first chip, and that a first module obtains first data includes: The first module receives a plurality of pieces of first subdata that are sent by a second module through one lane of an attachment unit interface AUI, where the second module is located on a second chip, and the plurality of pieces of first subdata are data that is encoded by using the first FEC code type, on which interleaving processing is performed, and that is distributed through a physical medium attachment PMA sublayer. The first module performs alignment marker AM lock on the plurality of pieces of first subdata, and uses AM locked data as the first data.

In an embodiment, that the first module performs second processing on the plurality of second codewords, to obtain second data includes: The first module performs interleaving processing on the plurality of second codewords, groups an interleaving result based on a symbol or at least one bit required for data modulation, and distributes grouped data to a corresponding data lane; and obtains the second data based on data that is in each data lane.

In an embodiment, that the first module performs second processing on the plurality of second codewords, to obtain second data includes: The first module groups the plurality of second codewords based on a symbol or at least one bit required for data modulation, and distributes grouped data to a corresponding data lane; and obtains the second data based on data that is in each data lane.

In an embodiment, the obtaining the second data based on data that is in each data lane includes: inserting, into the data that is in each data lane, a training sequence and a pilot symbol that are required by a coherent link, to obtain processed data, and inserting, into the processed data, the data that is for frequency adjustment, to obtain the second data.

In an embodiment, the obtaining the second data based on data that is in each data lane includes: inserting, into the data that is in each data lane, the data that is for frequency adjustment, to obtain processed data, and inserting, into the processed data, a training sequence and a pilot symbol that are required by a coherent link, to obtain the second data.

In an embodiment, the performing interleaving processing on the plurality of first codewords includes: performing direct interleaving on the plurality of first codewords, where a quantity of interleaved codewords is a quantity of codewords participating in the interleaving; performing staggered interleaving on the plurality of first codewords at a reference interval, where a quantity of interleaved codewords is a quantity of codewords participating in the interleaving, and the reference interval is a quantity of code blocks by which two codewords are staggered; or performing convolutional interleaving on the plurality of first codewords, where a quantity of interleaved codewords is a quantity of codewords participating in the interleaving.

In an embodiment, the performing interleaving processing on the plurality of second codewords includes: interleaving second codewords that are in the plurality of second codewords and that are from a same encoder; interleaving a plurality of second codewords that are in the plurality of second codewords and that are from a plurality of encoders; or interleaving second codewords that are in the plurality of second codewords and that are from a same encoder, and further interleaving a plurality of data streams that are obtained through interleaving and that are from a plurality of encoders.

In an embodiment, that the first module encodes the first data based on a second FEC code type, to obtain a plurality of second codewords includes: The first module distributes the first data to obtain a plurality of pieces of second subdata, and the first module separately encodes the plurality of pieces of second subdata based on the second FEC code type, to obtain the plurality of second codewords.

In an embodiment, that the first module distributes the first data to obtain a plurality of pieces of second subdata includes: The first module distributes the first data through a physical coding sublayer PCS lane, to obtain the plurality of pieces of second subdata. Alternatively, the first module distributes the first data through a physical medium attachment PMA sublayer, to obtain the plurality of pieces of second subdata.

In an embodiment, that the first module transmits the second data includes: The first module distributes the second data to obtain a plurality of pieces of third subdata, and sends the plurality of pieces of third subdata through a plurality of logical lanes.

According to a second aspect, a data transmission method is provided. The method includes: A third module obtains second data, where the second data is data obtained by encoding first data by using a second forward error correction FEC code type and performing second processing, the first data is data that is encoded by using a first FEC code type and on which first processing is performed, and the first processing includes interleaving processing. The third module decodes the second data based on the second FEC code type, to obtain decoded data.

In an embodiment, that a third module obtains second data includes: The third module receives a plurality of pieces of third subdata, and restores the second data based on the plurality of pieces of third subdata.

According to a third aspect, a data transmission apparatus is provided. The apparatus is used in a first module, and the apparatus includes:

an obtaining unit, configured to obtain first data, where the first data is data that is encoded by using a first forward error correction FEC code type and on which first processing is performed, and the first processing includes interleaving processing;

an encoding unit, configured to encode the first data based on a second FEC code type, to obtain a plurality of second codewords;

a processing unit, configured to perform second processing on the plurality of codewords to obtain second data; and a transmission unit, configured to transmit the second data.

In an embodiment, the second processing includes inserting at least one of a training sequence and a pilot symbol required by a coherent link.

In an embodiment, at least one of the first processing and the second processing further includes inserting data that is for frequency adjustment.

In an embodiment, the obtaining unit is configured to: receive a plurality of pieces of first subdata sent by a second module, where the plurality of pieces of first subdata are data that is encoded by using the first FEC code type and that is distributed through a physical medium attachment PMA sublayer; align the plurality of pieces of first subdata to obtain a plurality of first codewords; and perform interleaving processing on the plurality of first codewords to obtain the first data.

In an embodiment, the obtaining unit is configured to: receive a plurality of pieces of first subdata sent by a second module, where the plurality of pieces of first subdata are data that is encoded by using the first FEC code type, on which interleaving processing is performed, and that is distributed through a physical medium attachment PMA sublayer; align the plurality of pieces of first subdata to obtain a plurality of first codewords; and perform interleaving processing on the plurality of first codewords to obtain the first data.

In an embodiment, the obtaining unit is configured to: align the plurality of pieces of first subdata, and perform de-interleaving on the aligned data, to obtain the plurality of first codewords based on a result of the de-interleaving; or align the plurality of pieces of first subdata, and use the aligned data as the plurality of first codewords.

In an embodiment, the obtaining unit is configured to: receive a plurality of pieces of first subdata sent by a second module, where the plurality of pieces of first subdata are data that is encoded by using the first FEC code type, on which interleaving processing is performed, and that is distributed through a physical medium attachment PMA sublayer; and align the plurality of pieces of first subdata to obtain the first data.

In an embodiment, the first module is located on a first chip, the second module is located on a second chip, and the obtaining unit is configured to receive the plurality of pieces of first subdata that are sent by the second module through a plurality of lanes of an attachment unit interface AUI.

In an embodiment, the first module is located on a first chip, and the obtaining unit is configured to: receive a plurality of pieces of first subdata that are sent by a second module through one lane of an attachment unit interface AUI, where the second module is located on a second chip, and the plurality of pieces of first subdata are data that is encoded by using the first FEC code type and that is distributed through a physical medium attachment PMA sublayer, or the plurality of pieces of first subdata are data that is encoded by using the first FEC code type, on which interleaving processing is performed, and that is distributed through a physical medium attachment PMA sublayer; perform alignment marker AM lock on the plurality of pieces of first subdata, to obtain a plurality of first codewords; and perform interleaving processing on the plurality of first codewords, to obtain the first data.

In an embodiment, the plurality of pieces of first subdata are data that is encoded by using the first FEC code type, on which interleaving processing is performed, and that is distributed through the physical medium attachment PMA sublayer, and the obtaining unit is configured to: perform AM lock on the plurality of pieces of first subdata; and perform de-interleaving on AM locked data, to obtain a plurality of first codewords based on a result of the de-interleaving; or perform AM lock on the plurality of pieces of first subdata, and use AM locked data as the plurality of first codewords.

In an embodiment, the first module is located on a first chip, and the obtaining unit is configured to: receive a plurality of pieces of first subdata that are sent by a second module through one lane of an attachment unit interface AUI, where the second module is located on a second chip, and the plurality of pieces of first subdata are data that is encoded by using the first FEC code type, on which interleaving processing is performed, and that is distributed through a physical medium attachment PMA sublayer; and perform alignment marker AM lock on the plurality of pieces of first subdata, and use AM locked data as the first data.

In an embodiment, the processing unit is configured to: perform interleaving processing on the plurality of second codewords, group an interleaving result based on a symbol or at least one bit required for data modulation, and distribute grouped data to a corresponding data lane; and obtain the second data based on data that is in each data lane.

In an embodiment, the processing unit is configured to: group the plurality of second codewords based on the symbol or the at least one bit required for data modulation, and distribute grouped data to a corresponding data lane; and obtain the second data based on data that is in each data lane.

In an embodiment, the processing unit is configured to: insert, into the data that is in each data lane, a training sequence and a pilot symbol that are required by a coherent link, to obtain processed data, and insert, into the processed data, the data that is for frequency adjustment, to obtain the second data.

In an embodiment, the processing unit is configured to: insert, into the data that is in each data lane, the data that is for frequency adjustment, to obtain processed data, and insert, into the processed data, a training sequence and a pilot symbol that are required by a coherent link, to obtain the second data.

In an embodiment, the obtaining unit is configured to: perform direct interleaving on the plurality of first codewords, where a quantity of interleaved codewords is a quantity of codewords participating in the interleaving; perform staggered interleaving on the plurality of first codewords at a reference interval, where a quantity of interleaved codewords is a quantity of codewords participating in the interleaving, and the reference interval is a quantity of code blocks by which two codewords are staggered; or perform convolutional interleaving on the plurality of first codewords, where a quantity of interleaved codewords is a quantity of codewords participating in the interleaving.

In an embodiment, the processing unit is configured to: interleave second codewords that are in the plurality of second codewords and that are from a same encoder; interleave a plurality of second codewords that are in the plurality of second codewords and that are from a plurality of encoders; or interleave second codewords that are in the plurality of second codewords and that are from a same encoder, and further interleave a plurality of data streams that are obtained through interleaving and that are from a plurality of encoders.

In an embodiment, the encoding unit is configured to: distribute the first data to obtain a plurality of pieces of second subdata, and separately encode the plurality of pieces of second subdata based on the second FEC code type, to obtain the plurality of second codewords.

In an embodiment, the encoding unit is configured to: distribute the first data through a physical coding sublayer PCS lane, to obtain the plurality of pieces of second subdata; or distribute the first data through a physical medium attachment PMA sublayer, to obtain the plurality of pieces of second subdata.

In an embodiment, the transmission unit is configured to: distribute the second data to obtain a plurality of pieces of third subdata, and send the plurality of pieces of third subdata through a plurality of logical lanes.

According to a fourth aspect, a data transmission apparatus is provided. The apparatus is used in a third module, and the apparatus includes:

an obtaining unit, configured to obtain second data, where the second data is data obtained by encoding first data by using a second forward error correction FEC code type and performing second processing, the first data is data that is encoded by using a first FEC code type and on which first processing is performed, and the first processing includes interleaving processing; and a decoding unit, configured to decode the second data based on the second FEC code type, to obtain decoded data.

In an embodiment, the obtaining unit is configured to: receive a plurality of pieces of third subdata, and restore the second data based on the plurality of pieces of third subdata.

According to a fifth aspect, a data transmission device is provided. The device includes a processor, where the processor is coupled to a memory, the memory stores at least one program instruction or code, and the at least one program instruction or code is loaded and executed by the processor, so that the device implements the data transmission method according to either of the first aspect or the second aspect.

According to a sixth aspect, a data transmission system is provided. The system includes: a device for transmitting first data, configured to perform the method according to any one of the first aspect or the implementations thereof, and a device for transmitting second data, configured to perform the method according to any one of the second aspect or the implementations thereof.

According to a seventh aspect, a computer-readable storage medium is provided. The computer-readable storage medium stores at least one program instruction or code. When the program instruction or code is loaded and executed by a processor, a computer is enabled to implement the data transmission method according to any one of the first aspect or the second aspect.

Another communication apparatus is provided. The apparatus includes a communication interface, a memory, and a processor. The memory and the processor communicate with each other through an internal connection path. The memory is configured to store instructions. The processor is configured to execute the instructions stored in the memory, to control the communication interface to receive data and control the communication interface to send data. When the processor executes the instructions stored in the memory, the processor is enabled to perform the method in any one of the first aspect or the possible implementations of the first aspect, or perform the method in any one of the second aspect or the possible implementations of the second aspect.

In an embodiment, there are one or more processors, and there are one or more memories.

In an embodiment, the memory may be integrated with the processor, or the memory is disposed independently of the processor.

In a specific implementation process, the memory may be a non-transitory memory, for example, a read-only memory (ROM), and the memory and the processor may be integrated on a same chip, or may be separately disposed on different chips. A type of the memory and a manner of setting the memory and the processor are not limited in embodiments of this application.

A computer program (product) is provided. The computer program includes computer program code. When the computer program code is run on a computer, the computer is enabled to perform the methods in the foregoing aspects.

A chip is provided, includes a processor, and is configured to: invoke, from a memory, instructions stored in the memory and run the instructions, so that a device on which the chip is installed performs the methods in the foregoing aspects.

Another chip is provided. The chip includes: an input interface, an output interface, a processor, and a memory. The input interface, the output interface, the processor, and the memory are connected to each other through an internal connection path. The processor is configured to execute code that is in the memory. When the code is executed, the processor is configured to perform the methods in the foregoing aspects.

A device is provided, and includes the chip according to any one of the foregoing solutions.

A device is provided, and includes the first chip according to any one of the foregoing solutions and/or the third chip according to any one of the foregoing solutions.

DESCRIPTION OF EMBODIMENTS

Figure 1:
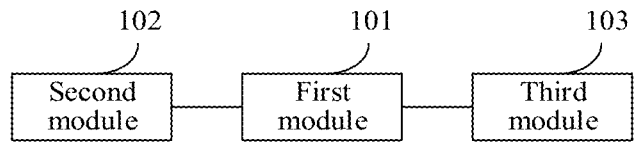
FIG. 1 is a schematic diagram of an implementation scenario of a data transmission method according to an embodiment of this application.

Terms used in an implementation part of this application are merely used to explain embodiments of this application, and are not intended to limit this application. The following describes embodiments of the present application with reference to accompanying drawings.

In the field of communications technologies, with the increase of a data transmission rate, channel loss and noise limit a data transmission rate and distance. An FEC provides error correction protection for data in transmission, and reduces a bit error ratio in a data transmission process, thereby improving the data transmission rate and transmission distance on a channel. However, as the data transmission rate increases continuously, the transmission distance increases continuously, and a requirement for the FEC becomes higher. Meanwhile, a stronger FEC usually requires more parity bits, and as a result, data requires higher bandwidth. Therefore, an FEC with a higher coding gain may be required in a scenario in which an increased link rate poses more challenges to a channel. For example, for an Ethernet interface of 800 gigabit Ethernet (GE)/1.6 terabit Ethernet (TE), or a 200G 4-level pulse amplitude modulation (4-level pulse amplitude modulation, PAM4) optical link, higher-rate transmission are usually oriented for stricter channel and bit error ratio requirements, and a stronger FEC can keep a post-correction bit error ratio at a good level after a pre-correction bit error ratio increases.

A shorter transmission distance indicates a lower proportion of a path delay to an overall transmission delay, and correspondingly, a higher proportion of a delay is caused by the FEC, which becomes a constraint factor of a system delay. For example, a fiber delay is about 50 us in a distance of 10 km, and an FEC delay of 1 us is only 2% of the path delay. By contrast, the fiber delay is 5 us in a distance of 1 km, and the FEC delay of 1 us is 20% of the path delay. This proportion continues to increase as the distance is further shortened, which is clearly unacceptable.

In this case, embodiments of this application provide a data transmission method. In the method, a first module that transmits data further encodes, by using a second FEC code type, obtained first data encoded by using a first FEC code type, to obtain second data on which concatenated encoding is performed, so that the second data has a higher encoding gain. During transmission on a lane prone to a bit error, effective error correction can be performed on data in which the bit error occurs, thereby improving data transmission quality. In addition, because the second data is data obtained by directly encoding the first data, an implementation process of the method is relatively simple, and data transmission efficiency is improved. In addition, because the first data is data obtained through interleaving processing, a correlation of error bits in a codeword obtained through second FEC code correction can be eliminated, thereby improving error correction performance and further improving data transmission quality.

The method in embodiments of this application may be applied to a current Ethernet interface or another scenario in which data needs to be transmitted. For example, a coherent light (coherent optics) usually has a relatively long burst bit error and a relatively high bit error ratio (BER). The method provided in embodiments of this application may be applied to concatenated FEC of a coherent link with a low delay. The implementation scenario shown in FIG. 1 is used as an example. The implementation scenario includes a plurality of modules, and the modules can exchange information to implement data transmission. As shown in FIG. 1, data transmission may be performed between a first module 101 and a second module 102, and between the first module 101 and a third module 103. It should be noted that the implementation scenario shown in FIG. 1 may include N modules, where N is a positive integer greater than or equal to 2. In FIG. 1, only an example in which there are three modules is used for description. In addition, the modules may be located on a same chip, or may be located on different chips.

Figure 2:
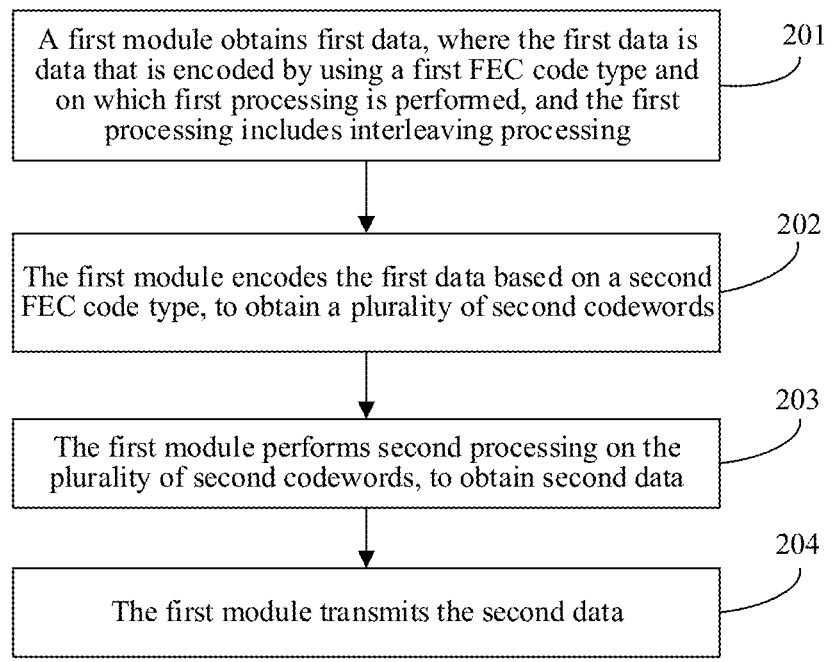
FIG. 2 is a flowchart of a data transmission method according to an embodiment of this application.

With reference to the implementation scenario shown in FIG. 1, the data transmission method provided in embodiments of this application is shown in FIG. 2, and includes but is not limited to operation 201 to operation 203.

Operation 201: A first module obtains first data, where the first data is data that is encoded by using a first FEC code type and on which first processing is performed, and the first processing includes interleaving processing.

In the method provided in embodiments of this application, a concatenated encoding manner is used. The first module further encodes, by using a second FEC code type, the obtained first data encoded by using the first FEC code type, to obtain second data on which concatenated encoding is performed. A correlation of error bits in a codeword that is latter encoded by using the second FEC code type can be eliminated through interleaving processing, to improve error correction performance. Therefore, the first data is data that is encoded by using the first FEC code type and on which first processing is performed, and the first processing includes the interleaving processing.

A manner in which the first module obtains the first data is not limited in embodiments of this application. In an embodiment, the first module and the second module can perform data transmission, and the first module receives a plurality of pieces of first subdata sent by the second module, and obtains the first data based on the first subdata.

The first subdata is data encoded by using the first FEC code type. The first FEC code type is not limited in embodiments of this application. For example, the first FEC code type is any one of a Reed-Solomon (RS) code, a Bose-Chaudhuri-Hocquenghem (BCH) code, a fire code, a turbo code, a turbo product code (TPC), a staircase code, and a low-density parity-check (LDPC) code.

In addition to encoding by using the first FEC code type, other processing is further performed on the first subdata. A processing manner of processing, other than encoding by using the first FEC code type, on the first subdata is not limited in embodiments of this application. For example, the first subdata is data that is encoded by using the first FEC code type and that is distributed through a physical medium attachment sublayer (PMA sublayer), or the first subdata is data that is encoded by using the first FEC code type, on which interleaving processing is performed, and that is distributed through a PMA sublayer. In different cases of the first subdata, a manner in which the first module obtains the first data includes but is not limited to the following four manners.

Manner 1 of obtaining the first data: That the first module obtains the first data includes: The first module receives the plurality of pieces of first subdata sent by the second module, where the plurality of pieces of first subdata are data that is encoded by using the first FEC code type and that is distributed through the PMA sublayer. The first module aligns the plurality of pieces of first subdata to obtain a plurality of first codewords. The first module performs interleaving processing on the plurality of first codewords to obtain the first data.

In Manner 1 of obtaining the first data, the first module is located on a first chip, and the second module is located on a second chip. That the first module receives the plurality of pieces of first subdata sent by the second module includes but is not limited to: The first module receives the plurality of pieces of first subdata sent by the second module through a plurality of lanes of an attachment unit interface (AUI). For example, one piece of first subdata is sent through one lane of the AUI.

The plurality of pieces of first subdata are data that is encoded by using the first FEC code type and that is distributed through the PMA sublayer, but interleaving processing is not performed on the first subdata. Therefore, to obtain the first data on which interleaving processing is performed, after receiving the plurality of pieces of first subdata, the first module aligns the plurality of pieces of first subdata to obtain the plurality of first codewords, and then performs interleaving processing on the plurality of first codewords to obtain the first data. In Manner 1 of obtaining the first data, the interleaving processing is not performed on the first subdata, but the first module performs interleaving processing on the plurality of first codewords. In this way, in embodiments of this application, encoding the first subdata by using the first FEC code type may be referred to as outer-code encoding, the first codeword is referred to as an outer-code codeword, and the outer-code encoding occurs in the second module.

A manner of aligning the plurality of pieces of first subdata is not limited in embodiments of this application. Because an alignment marker (AM) character is used as a boundary, the AM character can provide an existing mark for data identification, so as to facilitate subsequent identification of inserted data. Therefore, when the first subdata includes the AM character, alignment of the plurality of pieces of first subdata includes but is not limited to AM lock and deskew. The AM lock is for searching for the codeword boundary. After the codeword boundary is found, deskew may be performed in a manner defined in 400 GbE, to obtain the first codeword.

In embodiments of this application, interleaving processing performed by the first module on the plurality of first codewords is referred to as outer-code interleaving. Therefore, in Manner 1 of obtaining the first data, interleaving processing is not performed in the second module, and the outer-code interleaving is performed in the first module. A manner of performing interleaving processing, namely, outer-code interleaving, on the plurality of first codewords includes but is not limited to the following three manners.

Manner 1 of outer-code interleaving: Direct interleaving is performed on the plurality of first codewords, and a quantity of interleaved codewords is a quantity of codewords participating in the interleaving.

Figure 3:
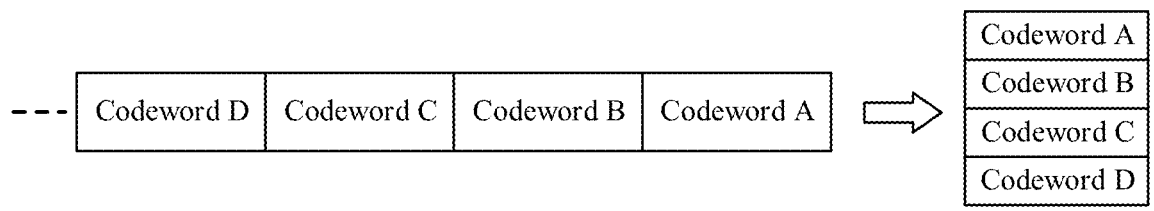
FIG. 3 is a schematic diagram of an interleaving process according to an embodiment of this application.

The direct interleaving means that the codewords participating in the interleaving are sequentially interleaved at an interleaving granularity without an interval, and a quantity of obtained interleaved codewords is the quantity of codewords participating in the interleaving. For example, as shown in FIG. 3, the plurality of first codewords are four codewords: codeword A, codeword B, codeword C, and codeword D. A quantity of interleaved codewords obtained by performing direct interleaving on the four codewords is the quantity of codewords participating in the interleaving. For example, the quantity of codewords participating in the interleaving in FIG. 3 is 4. In this case, the quantity of interleaved codewords is represented by M, where M=4.

Figure 4:
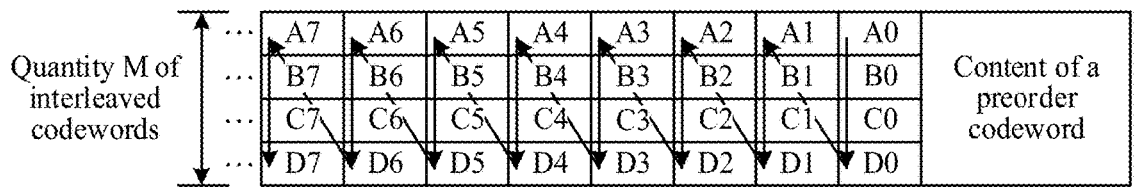
FIG. 4 is a schematic diagram of another interleaving process according to an embodiment of this application.
Figure 5:
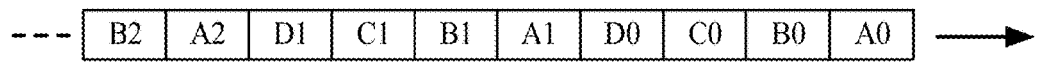
FIG. 5 is a schematic diagram of data sending according to an embodiment of this application.

As shown in FIG. 4, content of codeword A includes A0, A1, A2, A3, A4, A5, A6, and A7, content of codeword B includes B0, B1, B2, B3, B4, B5, B6, and B7, content of codeword C includes C0, C1, C2, C3, C4, C5, C6, and C7, and content of codeword D includes D0, D1, D2, D3, D4, D5, D6, and D7. After direct interleaving is performed on codeword A, codeword B, codeword C, and codeword D, A0, B0, C0, D0, A1, B1, C1, D1, . . . , and so on are sequentially sent in a direction shown by the arrows in FIG. 4. A sending sequence is shown in FIG. 5. In FIG. 4 and FIG. 5, a cell such as A0 or B0 represents the interleaving granularity. The interleaving granularity is not limited in embodiments of this application, and includes but is not limited to one bit, one quadrature amplitude modulation (QAM) 16 symbol, a plurality of bits, or a plurality of symbols.

Manner 2 of outer-code interleaving: Staggered interleaving is performed on the plurality of first codewords at a reference interval, where a quantity of interleaved codewords is a quantity of codewords participating in the interleaving, and the reference interval is a quantity of code blocks by which two codewords are staggered.

Figure 6:
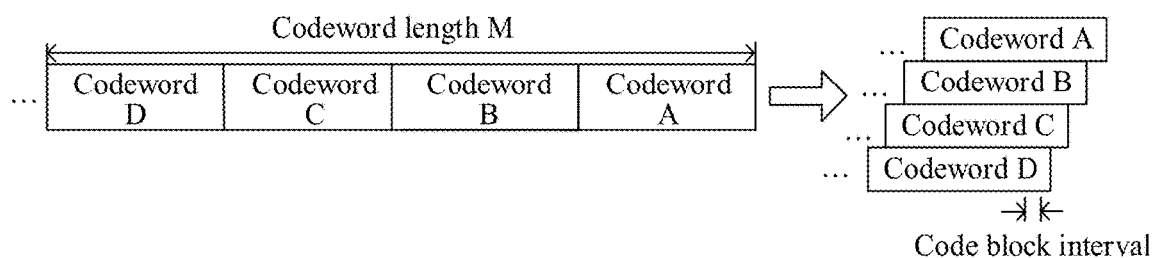
FIG. 6 is a schematic diagram of another interleaving process according to an embodiment of this application.

The staggered interleaving means that the codewords participating in the interleaving are sequentially interleaved at an interleaving granularity and at the reference interval, and a quantity of obtained interleaved codewords is the quantity of codewords participating in the interleaving. For example, as shown in FIG. 6, the plurality of first codewords are four codewords: codeword A, codeword B, codeword C, and codeword D. A quantity of interleaved codewords obtained by performing staggered interleaving on the four codewords at the reference interval is the quantity of codewords participating in the interleaving. For example, the quantity of codewords participating in the interleaving in FIG. 6 is 4. In this case, the quantity of interleaved codewords is represented by M, where M=4.

Figure 7:
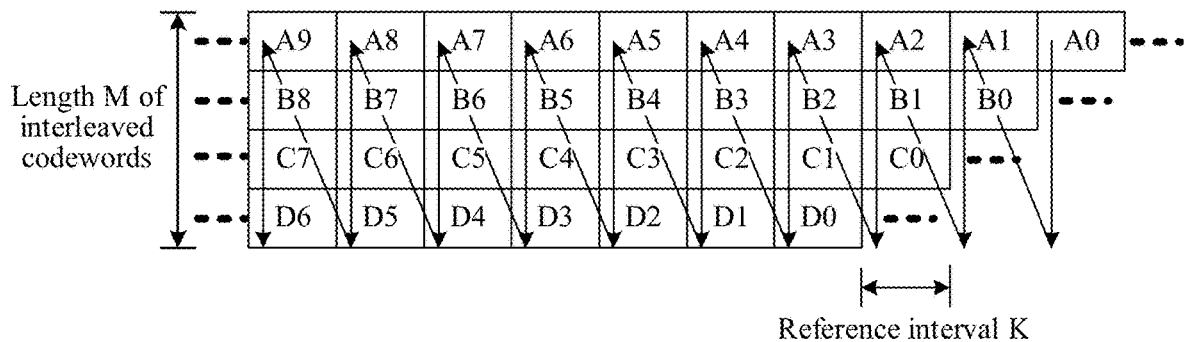
FIG. 7 is a schematic diagram of another interleaving process according to an embodiment of this application.

Content of codeword A includes A0, A1, A2, A3, A4, A5, A6, and A7, content of codeword B includes B0, B1, B2, B3, B4, B5, B6, and B7, content of codeword C includes C0, C1, C2, C3, C4, C5, C6, and C7, and content of codeword D includes D0, D1, D2, D3, D4, D5, D6, and D7. For example, the reference interval is K code blocks, and K=1. To be specific, after codeword A, codeword B, codeword C, and codeword D are sequentially interleaved in a staggered manner at an interleaving granularity and by a delay of one code block, A0, A1, B0, A2, B1, C0, A3, B2, C1, D0, A4, B3, C2, D1, . . . , and so on are sent in a direction shown by the arrows in FIG. 7. In FIG. 7, a cell such as A0 or B0 represents the interleaving granularity. The interleaving granularity is not limited in embodiments of this application, and includes but is not limited to one bit, one QAM16 symbol, a plurality of bits, or a plurality of symbols.

In an embodiment, in FIG. 7, an example in which K=1, in other words, the reference interval is one code block is used only for description, but this is not intended to limit this application. Alternatively, K may be another value, in other words, the reference interval may be another value. The reference interval is not limited in embodiments of this application.

Manner 3 of outer-code interleaving: Convolutional interleaving is performed on the plurality of first codewords, and a quantity of interleaved codewords is a quantity of codewords participating in the interleaving.

In Manner 3 of interleaving, codewords enter lanes with different delays in serial instead of in parallel. The convolutional interleaving means that an input bit stream, namely, the plurality of first codewords participating in the interleaving, is distributed, through polling in a unit of p-bit data block, to a plurality of registers with delays of different lengths. The delays corresponding to these registers are generally in an equal increment or decrement based on an arrival sequence of distributed data blocks, and then the data blocks with the unequal delays from the registers are aggregated into a same data stream to form an interleaved bit stream. A size of p is not limited in embodiments of this application, and may be set based on an application scenario or experience.

Figure 8:
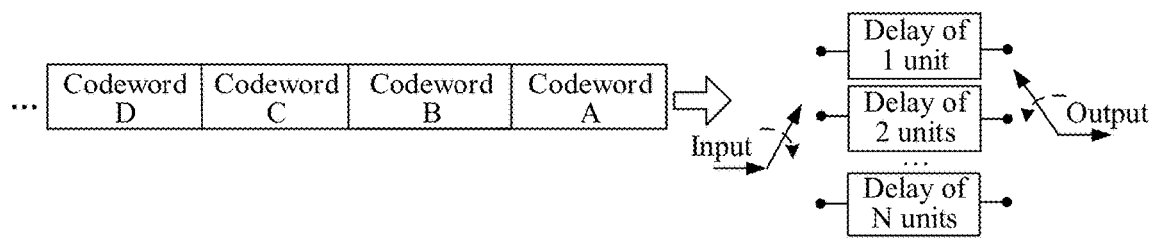
FIG. 8 is a schematic diagram of another interleaving process according to an embodiment of this application.

As shown in FIG. 8, the plurality of first codewords from the first module are sequentially distributed to N lanes in an initial arrangement sequence of original data sent by the first module, and each lane has a different delay. In FIG. 8, an example in which the delays corresponding to the registers are generally in an equal increment based on the arrival sequence of the distributed data blocks is used. A delay of lane 1 is one unit, a delay of lane 2 is two units, and so on. In an embodiment, a start point of delay increment may be 0 units. An example is used in which the delays corresponding to the registers are generally in an equal decrement based on the arrival sequence of the distributed data blocks. A delay of lane 1 may be a maximum value, for example, N units, a delay of lane 2 is (N−1) units, and so on. In an embodiment, a start point of delay decrement may alternatively be N−1, and the delay decrement ends at a minimum value 0.

Regardless of increment or decrement, the delay unit may be a delay corresponding to n bits, where n is a positive integer. For example, the selected value of n may be a code length of an inner code, namely, a code length of the second FEC code type.

Manner 2 of obtaining the first data: That the first module obtains the first data includes: The first module receives the plurality of pieces of first subdata sent by the second module, where the plurality of pieces of first subdata are data that is encoded by using the first FEC code type, on which interleaving processing is performed, and that is distributed through the physical medium attachment PMA sublayer. The first module aligns the plurality of pieces of first subdata to obtain a plurality of first codewords. The first module performs interleaving processing on the plurality of first codewords to obtain the first data.

In Manner 2 of obtaining the first data, the first module is located on a first chip, and the second module is located on a second chip. That the first module receives the plurality of pieces of first subdata sent by the second module includes but is not limited to: The first module receives the plurality of pieces of first subdata sent by the second module through a plurality of lanes of an AUI. For example, one piece of first subdata is sent through one lane of the AUI.

Because the plurality of pieces of first subdata are data that is encoded by using the first FEC code type, on which the interleaving processing is performed, and that is distributed through the PMA sublayer, after receiving the plurality of pieces of first subdata, the first module may align the plurality of pieces of first subdata to obtain the plurality of first codewords. Then, the interleaving processing is performed on the plurality of the first codewords, to obtain the first data. In Manner 2 of obtaining the first data, because interleaving processing is performed on the first subdata, and the first module performs interleaving processing on the plurality of first codewords, error correction performance can be further improved. In addition, in embodiments of this application, interleaving processing performed by the first module on the plurality of first codewords is referred to as outer-code interleaving. Therefore, in Manner 2 of obtaining the first data, interleaving processing is performed in the second module, and outer-code interleaving is performed in the first module.

A manner of aligning the plurality of pieces of first subdata also includes but is not limited to AM lock and deskew. In addition, for a manner of performing interleaving processing on the plurality of first codewords, refer to descriptions about Manners 1 to 3 of outer-code interleaving in Manner 1 of obtaining the first data. Details are not described herein again.

It should be noted that, in Manner 2 of obtaining the first data, because the plurality of pieces of first subdata are data that is encoded by using the first FEC code type, on which interleaving processing is performed, and that is distributed through the PMA sublayer, and interleaving processing further needs to be performed after the plurality of first codewords are obtained, when the first module aligns the plurality of pieces of first subdata to obtain the plurality of first codewords, a de-interleaving operation may be included or de-interleaving may not be performed, and interleaving processing is directly performed on the plurality of first codewords.

For example, that the first module aligns the plurality of pieces of first subdata to obtain a plurality of first codewords includes: The first module aligns the plurality of pieces of first subdata, performs de-interleaving on the aligned data, and obtains the plurality of first codewords based on a result of the de-interleaving. For example, if the interleaving performed in the second module is interleaving on two codewords, the first module obtains the plurality of pieces of first subdata, and aligns the plurality of pieces of first subdata, to obtain data of 2*n codeword lengths. In a case of de-interleaving, the data of the 2*n codeword lengths is de-interleaved, the plurality of first codewords are obtained based on a result of the de-interleaving, and the foregoing described Manners 1 to 3 of outer-code interleaving in Manner 1 of obtaining the first data are performed.

Alternatively, that the first module aligns the plurality of pieces of first subdata to obtain a plurality of first codewords includes: The first module aligns the plurality of pieces of first subdata, and uses the aligned data as the plurality of first codewords. For example, if the interleaving performed in the second module is interleaving on two codewords, the first module obtains the plurality of pieces of first subdata, and aligns the plurality of pieces of first subdata, to obtain data of 2*n codeword lengths. In a case of no de-interleaving, the data of the 2*n codeword lengths is used as 2*n codewords, namely, the plurality of first codewords, and the foregoing described Manners 1 to 3 of outer-code interleaving in Manner 1 of obtaining the first data are performed. In the case of no de-interleaving, the aligned data is directly used as the plurality of first codewords, so that a data transmission speed can be improved.

Manner 3 of obtaining the first data: That the first module obtains the first data includes: The first module receives the plurality of pieces of first subdata sent by the second module, where the plurality of pieces of first subdata are data that is encoded by using the first FEC code type, on which interleaving processing is performed, and that is distributed through the physical medium attachment PMA sublayer. The first module aligns the plurality of pieces of first subdata to obtain the first data.

In Manner 3 of obtaining the first data, the first module is located on a first chip, and the second module is located on a second chip. That the first module receives the plurality of pieces of first subdata sent by the second module includes but is not limited to: The first module receives the plurality of pieces of first subdata sent by the second module through a plurality of lanes of an AUI. For example, one piece of first subdata is sent through one lane of the AUI.

Because the plurality of pieces of first subdata are data that is encoded by using the first FEC code type, on which the interleaving processing is performed, and that is distributed through the PMA sublayer, after receiving the plurality of pieces of first subdata, the first module may not perform interleaving processing again, and may only align the plurality of pieces of first subdata. Therefore, operations of obtaining the first codewords can be reduced, and a delay and power consumption can be further reduced. In Manner 3 of obtaining the first data, the interleaving processing is performed on the first subdata, but the interleaving processing is not performed in the first module. Therefore, the interleaving processing is performed in the second module, and outer-code interleaving is not performed in the first module.

A manner of aligning the plurality of pieces of first subdata includes but is not limited to AM lock and deskew.

It should be noted that, in the foregoing Manner 1 to Manner 3 of obtaining the first data, when obtaining the first data, the first module receives, from the second module, the plurality of pieces of first subdata sent through the plurality of lanes of the AUI. In an embodiment, the first module may further receive the plurality of pieces of first subdata sent by the second module through one lane of the AUI. For details, refer to the following Manner 4 of obtaining the first data.

Manner 4 of obtaining the first data: The first module is located on a first chip, and that the first module obtains the first data includes: The first module receives a plurality of pieces of first subdata that are sent by a second module through one lane of an attachment unit interface AUI, where the second module is located on a second chip, and the plurality of pieces of first subdata are data that is encoded by using the first FEC code type and that is distributed through a PMA sublayer, or the plurality of pieces of first subdata are data that is encoded by using the first FEC code type, on which interleaving processing is performed, and that is distributed through a PMA sublayer. The first module performs AM lock on the plurality of pieces of first subdata to obtain the first data based on AM locked data.

For example, that the first module performs AM lock on the plurality of pieces of first subdata to obtain the first data based on AM locked data includes: The first module performs AM lock on the plurality of pieces of first subdata, to obtain the plurality of first codewords. The first module performs interleaving processing on the plurality of first codewords, to obtain the first data.

In Manner 4 of obtaining the first data, because the plurality of pieces of first subdata are sent through one lane of an AUI, and the plurality of pieces of first subdata are not only encoded by using the first FEC code type, but also distributed through the PMA sublayer, when interleaving processing is not performed on the plurality of pieces of first subdata, to obtain the first data on which the interleaving processing is performed, after the first module receives the plurality of pieces of first subdata, AM lock is performed on the plurality of pieces of first subdata to obtain the plurality of first codewords, and then interleaving processing is performed on the plurality of first codewords to obtain the first data. In Manner 4 of obtaining the first data, the interleaving processing is not performed on the first subdata, but the first chip performs interleaving processing on the plurality of first codewords, where in embodiments of this application, the interleaving processing performed by the first module on the plurality of first codewords is referred to as outer-code interleaving. Therefore, in Manner 4 of obtaining the first data, interleaving processing is not performed in the second module, and outer-code interleaving is performed in the first module.

In an embodiment, in Manner 4 of obtaining the first data, the plurality of pieces of first subdata are sent through one lane of an AUI, and the plurality of pieces of first subdata are not only encoded by using the first FEC code type, but also undergo interleaving processing and PMA distribution. When interleaving processing is performed on the plurality of pieces of first subdata, because interleaving processing further needs to be performed after the plurality of first codewords are obtained, in Manner 4 of obtaining the first data, when the first module performs AM lock on the plurality of pieces of first subdata to obtain the plurality of first codewords, a de-interleaving operation may be included, or the de-interleaving may not be performed and the interleaving processing is directly performed on the plurality of first codewords.

For example, that the first module performs AM lock on the plurality of pieces of first subdata to obtain the plurality of first codewords includes: The first module performs AM lock on the plurality of pieces of first subdata, de-interleaves AM locked data, and obtains the plurality of first codewords based on a result of the de-interleaving. For example, if the interleaving performed in the second module is interleaving on two codewords, the first module obtains the plurality of pieces of first subdata, and performs AM lock on the plurality of pieces of first subdata, to obtain data of 2*n codeword lengths. In a case of de-interleaving, the data of the 2*n codeword lengths is de-interleaved, the plurality of first codewords are obtained based on a result of the de-interleaving, and then the interleaving processing is performed on the plurality of first codewords.

Alternatively, that the first module performs AM lock on the plurality of pieces of first subdata to obtain the plurality of first codewords includes: The first module performs AM lock on the plurality of pieces of first subdata, and uses AM locked data as the plurality of first codewords. For example, if the interleaving performed in the second module is interleaving on two codewords, the first module obtains the plurality of pieces of first subdata, and performs AM lock on the plurality of pieces of first subdata, to obtain data of 2*n codeword lengths. In a case of no de-interleaving, the data of the 2*n codeword lengths is used as 2*n codewords, namely, the plurality of first codewords, and then interleaving processing is performed on the plurality of first codewords.

In addition, for a manner of performing interleaving processing on the plurality of first codewords, refer to descriptions about Manners 1 to 3 of outer-code interleaving in Manner 1 of obtaining the first data. Details are not described herein again.

In an embodiment, the plurality of pieces of first subdata are data that is encoded by using the first FEC code type, on which interleaving processing is performed, and that is distributed through the physical medium attachment PMA sublayer. That the first module performs AM lock on the plurality of pieces of first subdata to obtain the first data based on AM locked data includes: The first module performs AM lock on the plurality of pieces of first subdata, and uses the AM locked data as the first data.

For example, the first module is located on a first chip, and the second module is located on a second chip. That a first module obtains first data includes: The first module receives the plurality of pieces of first subdata that are sent by the second module through one lane of an AUI, where the plurality of pieces of first subdata are data that is encoded by using the first FEC code type, on which interleaving processing is performed, and that is distributed through the PMA sublayer. The first module performs alignment marker AM lock on the plurality of pieces of first subdata, and uses the AM locked data as the first data.

Operation 202: The first module encodes the first data based on the second FEC code type, to obtain a plurality of second codewords.

Regardless of which manner in the foregoing Manner 1 to Manner 4 of obtaining the first data is used to obtain the first data, to further improve error correction performance and implement concatenated encoding, after obtaining the first data, the first module encodes the first data based on the second FEC code type, to obtain the plurality of second codewords. Encoding the first data may be referred to as inner-code encoding, the second codeword is referred to as an inner-code codeword, and the inner-code encoding occurs in the first module.

The second FEC code type includes but is not limited to any one of an RS code, a BCH code, a far code, a turbo code, a turbo product code, a staircase code, or an LDPC code. A type of the second FEC code type is not limited in embodiments of this application. For example, if a code rate of the second codeword is R (where R=k/n), and a rate of the first data before encoding is D, a rate after encoding is D/R, where k is a length of codeword information bits, n is a length of the codeword, and the length of the codeword is the length of the information bits plus a length of parity bits. For example, the rate of the first data before encoding is D=425 Gb/s. If R=17/18 is selected, the rate after encoding is D/R=450 Gb/s. If R=239/256 is selected, the rate D/R after encoding is about 455.23 Gb/s.

In an embodiment, that the first module encodes the first data based on a second FEC code type, to obtain a plurality of second codewords includes: The first module distributes the first data to obtain a plurality of pieces of second subdata, and the first module separately encodes the plurality of pieces of second subdata based on the second FEC code type, to obtain the plurality of second codewords.

For example, that the first module distributes the first data to obtain the plurality of pieces of second subdata includes: The first module distributes the first data through a physical coding sublayer (PCS) lane to obtain the plurality of pieces of second subdata. Alternatively, the first module distributes the first data through the PMA sublayer to obtain the plurality of pieces of second subdata. In embodiments of this application, a quantity of pieces of second subdata obtained by the first module through distribution is not limited. For example, the quantity of pieces of second subdata obtained through distribution may be determined based on an application scenario or experience.

Operation 203: The first module performs second processing on the plurality of second codewords, to obtain the second data.

In an embodiment, a manner in which the first module performs second processing on the plurality of second codewords to obtain the second data includes but is not limited to the following two manners.

Manner 1 of obtaining the second data: That the first module performs second processing on the plurality of second codewords to obtain the second data includes: The first module performs interleaving processing on the plurality of second codewords, groups an interleaving result based on a symbol or at least one bit required for data modulation, and distributes grouped data to a corresponding data lane; and obtains the second data based on data that is in each data lane.

Figure 9:
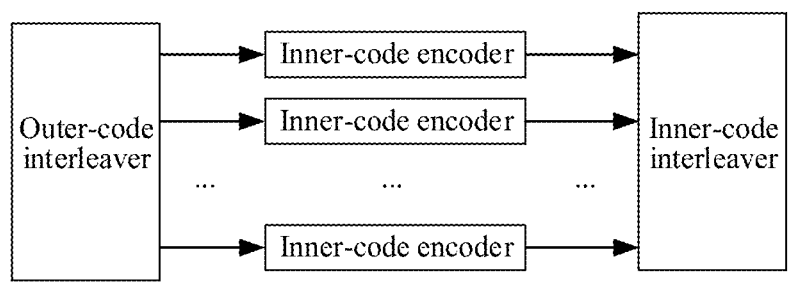
FIG. 9 is a schematic diagram of a structure of a data processing system according to an embodiment of this application.

In Manner 1 of obtaining the second data, interleaving processing is performed on the plurality of second codewords, so that a burst bit error on a link can be handled, and error correction performance is further improved. A manner of performing interleaving processing on the plurality of second codewords is not limited in embodiments of this application. P lanes of data are generated based on the second codewords on which the interleaving processing is performed, where P is an integer greater than or equal to 1. Each lane of data corresponds to an inner-code encoder. For example, as shown in FIG. 9, outer-code interleaving is implemented via an outer-code interleaver, inner-code interleaving is implemented via an inner-code interleaver, and each lane of data corresponds to an inner-code encoder. For example, the interleaving processing performed on the plurality of second codewords includes but is not limited to the following three interleaving processing manners.

Manner 1 of inner-code interleaving: Second codewords that are in the plurality of second codewords and that are from a same encoder are interleaved.

Figure 10:
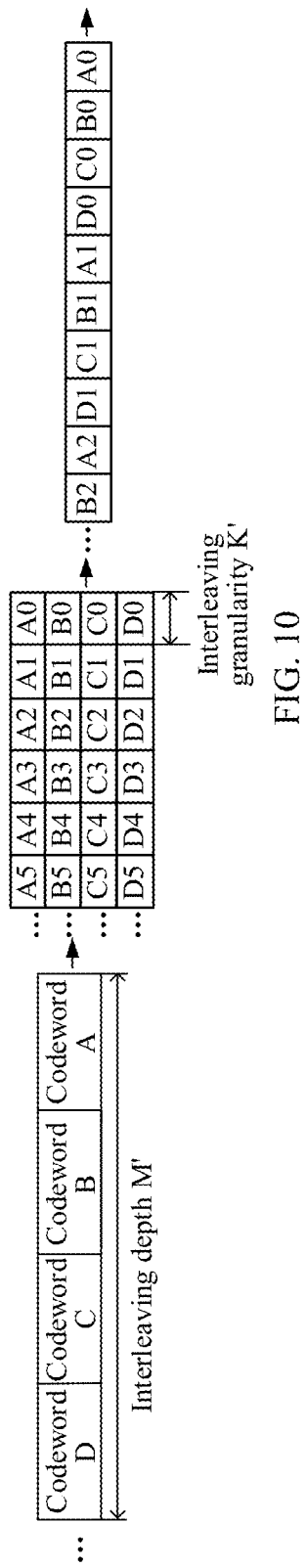
FIG. 10 is a schematic diagram of another interleaving process according to an embodiment of this application.

In Manner 1 of inner-code interleaving, a quantity of second codewords that are from a same encoder and that are in the plurality of second codewords is M', and interleaving may be performed on M' second codewords at an interleaving granularity K'. As shown in FIG. 10, for example, M' codewords from a same encoder are codeword A, codeword B, codeword C, and codeword D. Content of codeword A includes A0, A1, A2, A3, A4, A5, and so on; content of codeword B includes B0, B1, B2, B3, B4, B5, and so on; content of codeword C includes C0, C1, C2, C3, C4, C5, and so on; content of codeword D includes D0, D1, D2, D3, D4, D5, and so on. After codeword A, codeword B, codeword C, and codeword D are interleaved at the interleaving granularity K', A0, B0, C0, D0, A1, B1, C1, D1I, A2, B2, and so on are sent in a direction shown in FIG. 10. In FIG. 10, a cell such as A0 or B0 represents the interleaving granularity. The interleaving granularity K' is not limited in embodiments of this application, and includes but is not limited to one bit, one QAM16 symbol, a plurality of bits, or a plurality of symbols.

Manner 2 of inner-code interleaving: A plurality of second codewords that are in the plurality of second codewords and that are from a plurality of encoders are interleaved.

Figure 11:
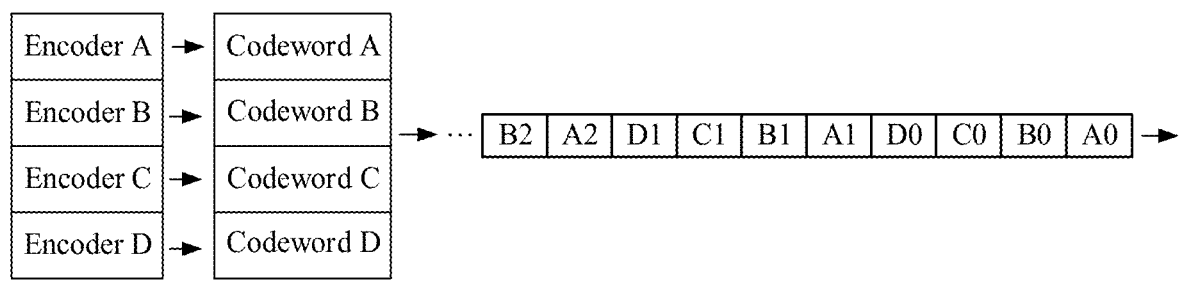
FIG. 11 is a schematic diagram of another interleaving process according to an embodiment of this application.

In Manner 2 of inner-code interleaving, because the plurality of second codewords that are in the plurality of second codewords and that are from the plurality of encoders are interleaved, a quantity of codewords participating in the interleaving is equal to a quantity of encoders. As shown in FIG. 11, an example is used in which four second codewords from encoder A, encoder B, encoder C, and encoder D are interleaved. The four second codewords are codeword A, codeword B, codeword C, and codeword D. Content of codeword A includes A0, A1, A2, A3, A4, A5, and so on; content of codeword B includes B0, B1, B2, B3, B4, B5, and so on; content of codeword C includes C0, C1, C2, C3, C4, C5, and so on; content of codeword D includes D0, D1, D2, D3, D4, D5, and so on. After codeword A, codeword B, codeword C, and codeword D are interleaved at the interleaving granularity K', A0, B0, C0, D0, A1, B1, C1, D1, A2, B2, and so on are sent in a direction shown in FIG. 11.

Manner 3 of inner-code interleaving: Second codewords that are in the plurality of second codewords and that are from a same encoder are interleaved, and a plurality of data streams that are from a plurality of encoders and that are obtained through the interleaving are further interleaved.

Manner 3 of inner-code interleaving is a combination of Manner 1 of inner-code interleaving and Manner 2 of inner-code interleaving. First, the second codewords that are in the plurality of second codewords and that are from the same encoder are interleaved, and second codewords from different encoders are separately interleaved, to obtain the plurality of data streams, where one encoder obtains one data stream. Afterward, the plurality of data streams that are from the plurality of encoders and that are obtained through the interleaving are further interleaved. Because interleaving in two dimensions is used in Manner 3 of inner-code interleaving, error correction performance of the second data obtained through inner-code interleaving is better.

Regardless of whether Manner 1 or Manner 2 of inner-code interleaving is used, in Manner 1 of obtaining the second data, a data stream can be obtained through inner-code interleaving. Afterward, the data stream may be divided based on a symbol required for data modulation, and distributed to data lanes corresponding to two polarization directions. For example, for consecutive 8-bit data, the first four bits are distributed to X polarization, and the last four bits are distributed to Y polarization.

In addition, it should be noted that, in the foregoing Manner 1 to Manner 3 of inner-code interleaving, regardless of whether interleaving is performed on second codewords from a same encoder, or interleaving is performed on a plurality of data streams from a plurality of encoders, or interleaving is performed on a plurality of second codewords from a plurality of encoders, interleaving may be performed in a manner of any one of the direct interleaving, the staggered interleaving, or the convolutional interleaving in the foregoing Manner 1 to Manner 3 of outer-code interleaving. A specific interleaving manner is not limited in embodiments of this application.

Manner 2 of obtaining the second data: That the first module performs second processing on the plurality of second codewords to obtain the second data includes: The first module groups the plurality of second codewords based on a symbol or at least one bit required for data modulation, and distributes grouped data to a corresponding data lane; and obtains the second data based on data that is in each data lane.

In Manner 2 of obtaining the second data, the first module does not perform interleaving processing on the second codewords, and may directly group the plurality of second codewords based on a symbol or at least one bit required for data modulation, thereby reducing a delay and power consumption of inner-code interleaving. For example, when the second codewords are grouped based on the symbol required for data modulation and distributed to data lanes corresponding to two polarization directions, the first four bits in the consecutive 8-bit data may be distributed to X polarization, and the last four bits may be distributed to Y polarization.

In an embodiment, the method provided in embodiments of this application may be applied to a coherent link. For a data stream for which inner code and outer code overheads are taken into consideration, when a training sequence (TS)/pilot symbol is inserted into the coherent link, a method for frequency adjustment may be used. Therefore, the second processing includes but is not limited to inserting at least one of the training sequence and the pilot symbol required by the coherent link.

In an embodiment, at least one of the first processing and the second processing further includes inserting data that is for frequency adjustment. In embodiments of this application, a type and content of the data that is for frequency adjustment are not limited. The data that is for frequency adjustment may be periodically inserted based on a fixed length. The fixed length and a periodicity may be determined based on an application scenario or experience. This is not limited in embodiments of this application. If the frequency is inappropriate, or the frequency does not meet a requirement, both the first processing and the second processing may include inserting the data that is for frequency adjustment, or the first processing or the second processing includes inserting the data that is for frequency adjustment. If the frequency is appropriate, neither the first processing nor the second processing may include inserting the data that is for frequency adjustment.

In addition, in embodiments of this application, a sequence of inserting the training sequence and the pilot symbol that are required by the coherent link and inserting the data that is for frequency adjustment is not limited.

For example, the obtaining the second data based on data that is in each data lane includes: inserting, into the data that is in each data lane, the training sequence and the pilot symbol that are required by the coherent link, to obtain processed data, and inserting, into the processed data, the data that is for frequency adjustment, to obtain the second data.

Alternatively, the obtaining the second data based on data that is in each data lane includes: inserting, into the data that is in each data lane, the data that is for frequency adjustment, to obtain processed data, and inserting, into the processed data, the training sequence and the pilot symbol that are required by the coherent link, to obtain the second data.

Figure 12:
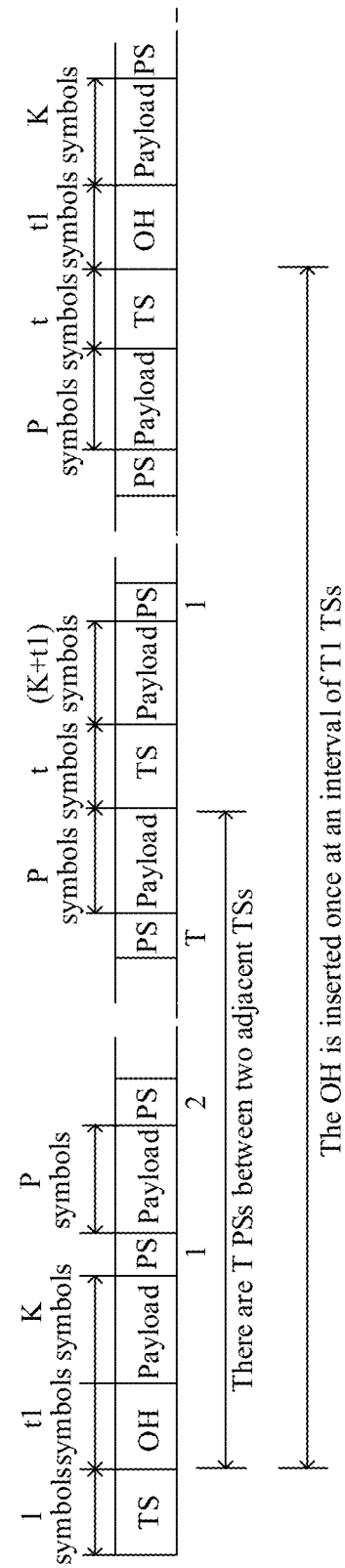
FIG. 12 is a schematic diagram of a data processing process according to an embodiment of this application.

It should be noted that the inserted training sequence and pilot symbol are not limited in embodiments of this application. For example, the inserted training sequence and pilot symbol may be preconfigured, and configuration is performed based on an application scenario or experience. If the frequency is already appropriate after the training sequence and the pilot symbol are inserted, a frequency adjustment operation does not need to be performed, in other words, the data that is for frequency adjustment does not need to be inserted. For example, in FIG. 12, TS corresponds to a training sequence, PS corresponds to a pilot symbol, and OH corresponds to additional data added without adjusting frequency. For example, the $1^{st}$ symbol of the TS is a part of a PS sequence.

For example, when t=t1=0 (in other words, TS and OH do not exist), K=0. In this case, a rate after encoding is D/R*(P+1)/P. If P=72, the final rate is 456.25 Gb/s. In DP-QAM16 modulation, a baud rate corresponding to the code rate is 57.03125 GBd, and is 365 times of fundamental frequency 156.25 MHz.

For another example, when t≠0, in other words, when the TS exists, it needs to be considered that the baud rate corresponding to D_out is also integer frequency multiplication. For example, if t=10, t1=63, T=100, and T1=1, D_out=457.5 Gb/s. In DP-QAM16 modulation, the baud rate is 366 times of fundamental frequency 156.25 MHz.

It should be noted that a value of t1 may be greater than P. In this case, content of the OH may cross one or more PSs.

Operation 204: The first module transmits the second data.

In an embodiment, that the first module transmits the second data includes: The first module distributes the second data to obtain a plurality of pieces of third subdata, and sends the plurality of pieces of third subdata through a plurality of logical lanes.

In embodiments of this application, a quantity of pieces of third subdata obtained by the first module by distributing the second data is not limited. For example, the quantity of pieces of third subdata obtained through distribution may be determined based on an application scenario or experience.

According to the method provided in embodiments of this application, the first module that transmits data further encodes, by using the second FEC code type, obtained first data encoded by using the first FEC code type, to obtain the second data on which concatenated encoding is performed, so that the second data has a higher encoding gain. During transmission on a lane prone to a bit error, effective error correction can be performed on data in which the bit error occurs, thereby improving data transmission quality. Because the second data is data obtained by directly encoding the first data, an implementation process of the method is relatively simple, and data transmission efficiency is improved. In addition, because the first data is data obtained through the interleaving processing, a correlation of error bits in a codeword obtained through second FEC code correction can be eliminated, thereby improving error correction performance. In addition, error correction performance can be further improved by using both the outer-code interleaving and the inner-code interleaving.

Next, with reference to the method procedure shown in FIG. 2, the data transmission method provided in embodiments of this application is described by using an example in which the first module is located on the first chip, and the second module is located on the second chip for the following several scenarios.

Scenario 1: The second chip does not perform interleaving processing, and the first chip performs outer-code interleaving and inner-code interleaving.

Figure 13:
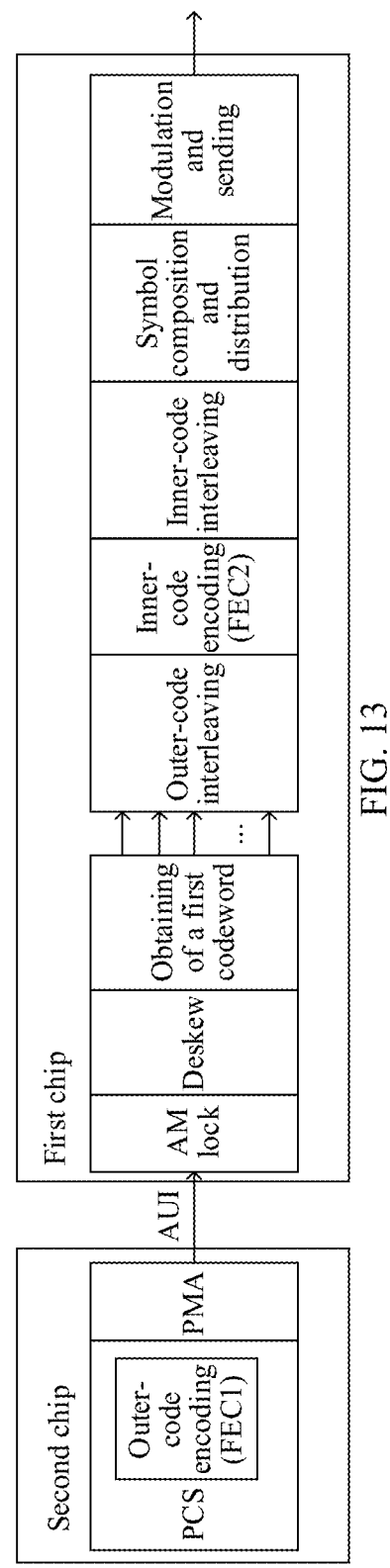
FIG. 13 is a schematic diagram of an implementation environment of an application scenario according to an embodiment of this application.

Scenario 1 is a combination of Manner 1 of obtaining the first data and Manner 1 of obtaining the second data in the embodiment shown in FIG. 2. In other words, the second chip does not perform interleaving processing, and the first chip performs interleaving processing on both the first codewords and the second codewords. An implementation environment of this scenario may be shown in FIG. 13, and a data transmission process is as follows.

The second chip performs outer-code encoding, namely, encoding by using FEC1 (the first FEC code type) on original data, distributes encoded data through the PMA sublayer, to obtain the plurality of pieces of first subdata, and then sends the plurality of pieces of first subdata to the first chip through the AUI. The plurality of pieces of first subdata are data that is encoded by using the first FEC code type and that is distributed through the PMA sublayer. After receiving the plurality of pieces of first subdata, the first chip performs AM lock and deskew on the plurality of pieces of first subdata, to implement an alignment operation and obtain the plurality of first codewords. Then, the first chip performs interleaving processing, namely, outer-code interleaving, on the plurality of first codewords, to obtain the first data.

Further, after encoding the first data based on the second FEC code type, to obtain the plurality of second codewords, the first chip performs interleaving processing, namely, inner-code interleaving, on the plurality of second codewords, groups the interleaving result based on the symbol required for data modulation, and distributes the grouped data to the corresponding data lane; and obtains the second data based on data that is in each data lane. Finally, the second data is modulated and sent.

Scenario 2: The second chip does not perform interleaving processing, the first chip performs outer-code interleaving and inner-code interleaving, and the first chip performs frequency adjustment and TS/pilot insertion.

Figure 14:
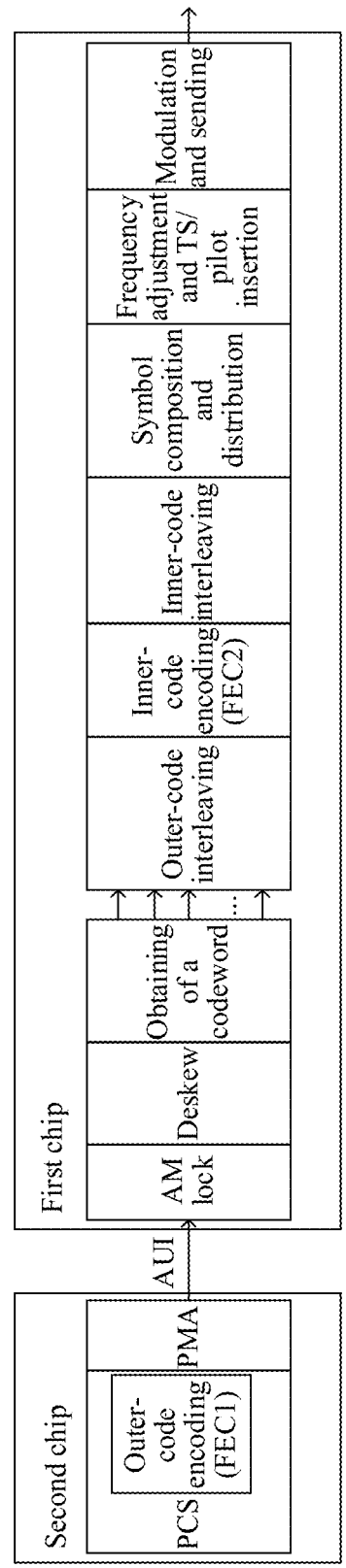
FIG. 14 is a schematic diagram of an implementation environment of another application scenario according to an embodiment of this application.

In Scenario 2, operations of frequency adjustment and TS/pilot insertion are added on the basis of Scenario 1. Therefore, Scenario 2 may also be a combination of Manner 1 of obtaining the first data and Manner 1 of obtaining the second data in the embodiment shown in FIG. 2. In other words, the second chip does not perform interleaving processing, and the first chip performs interleaving processing on both the first codewords and the second codewords. An implementation environment of this scenario may be shown in FIG. 14, and a data transmission process is as follows.

The second chip performs outer-code encoding, namely, encoding by using FEC1 (the first FEC code type) on original data, distributes encoded data through the PMA sublayer, to obtain the plurality of pieces of first subdata, and then sends the plurality of pieces of first subdata to the first chip through the AUI. The plurality of pieces of first subdata are data that is encoded by using the first FEC code type and that is distributed through the PMA sublayer. After receiving the plurality of pieces of first subdata, the first chip performs AM lock and deskew on the plurality of pieces of first subdata, to implement an alignment operation and obtain the plurality of first codewords. Then, the first chip performs interleaving processing, namely, outer-code interleaving, on the plurality of first codewords, to obtain the first data.

Further, after encoding the first data based on the second FEC code type, to obtain the plurality of second codewords, the first chip performs interleaving processing, namely, inner-code interleaving, on the plurality of second codewords, groups the interleaving result based on the symbol required for data modulation, and distributes the grouped data to the corresponding data lane; and obtains the second data based on data that is in each data lane. Finally, the second data is modulated and sent.

In Scenario 2, the obtaining the second data based on data that is in each data lane includes: inserting, into the data that is in each data lane, the training sequence and the pilot symbol that are required by the coherent link, to obtain the processed data, and inserting, into the processed data, the data that is for frequency adjustment, to obtain the second data.

Alternatively, the obtaining the second data based on data that is in each data lane includes: inserting, into the data that is in each data lane, the data that is for frequency adjustment, to obtain the processed data, and inserting, into the processed data, the training sequence and the pilot symbol that are required by the coherent link, to obtain the second data.

Scenario 3: The second chip does not perform interleaving processing, the first chip performs outer-code interleaving but does not perform inner-code interleaving, and the first chip performs frequency adjustment and TS/pilot insertion.

Figure 15:
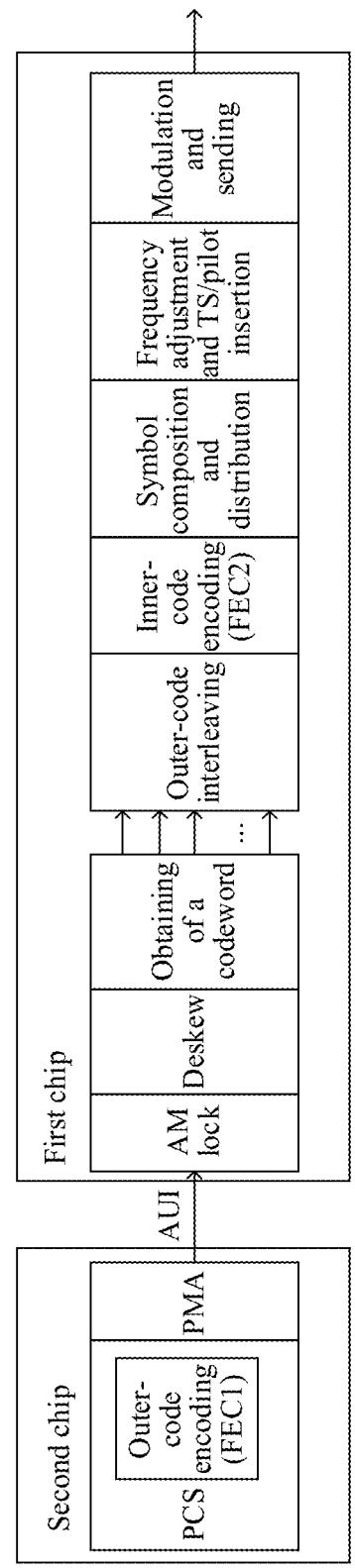
FIG. 15 is a schematic diagram of an implementation environment of another application scenario according to an embodiment of this application.

An operation of performing inner-code interleaving by the first chip is omitted in Scenario 3 compared with that in Scenario 2. Scenario 3 is a combination of Manner 1 of obtaining the first data and Manner 2 of obtaining the second data in the embodiment shown in FIG. 2. In other words, the second chip does not perform interleaving processing, and the first chip performs outer-code interleaving processing on only the first codewords. An implementation environment of this scenario may be shown in FIG. 15, and a data transmission process is as follows.

The second chip performs outer-code encoding, namely, encoding by using FEC1 (the first FEC code type) on original data, distributes encoded data through the PMA sublayer, to obtain the plurality of pieces of first subdata, and then sends the plurality of pieces of first subdata to the first chip through the AUI. The plurality of pieces of first subdata are data that is encoded by using the first FEC code type and that is distributed through the PMA sublayer. After receiving the plurality of pieces of first subdata, the first chip performs AM lock and deskew on the plurality of pieces of first subdata, to implement an alignment operation and obtain the plurality of first codewords. Then, the first chip performs interleaving processing, namely, outer-code interleaving, on the plurality of first codewords, to obtain the first data.

Further, after encoding the first data based on the second FEC code type, to obtain the plurality of second codewords, the first chip groups the plurality of second codewords based on the symbol required for data modulation, and distributes grouped data to the corresponding data lane; and obtains the second data based on data that is in each data lane. Finally, the second data is modulated and sent.

In Scenario 3, the obtaining the second data based on data that is in each data lane includes: inserting, into the data that is in each data lane, the training sequence and the pilot symbol that are required by the coherent link, to obtain the processed data, and inserting, into the processed data, the data that is for frequency adjustment, to obtain the second data.

Alternatively, the obtaining the second data based on data that is in each data lane includes: inserting, into the data that is in each data lane, the data that is for frequency adjustment, to obtain the processed data, and inserting, into the processed data, the training sequence and the pilot symbol that are required by the coherent link, to obtain the second data.

Scenario 4: The second chip performs interleaving processing, the first chip performs outer-code interleaving and inner-code interleaving, and the first chip performs frequency adjustment and TS/pilot insertion.

Figure 16:
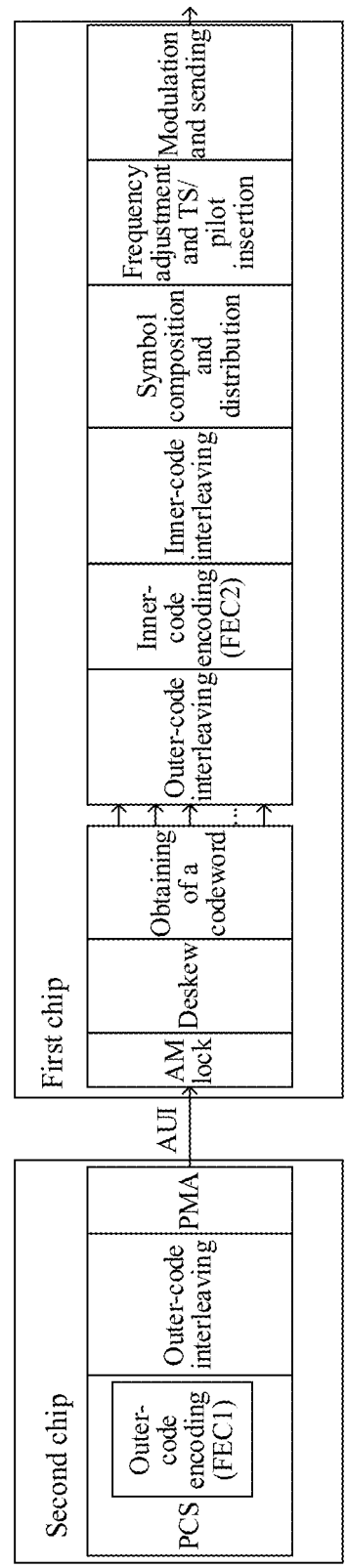
FIG. 16 is a schematic diagram of an implementation environment of another application scenario according to an embodiment of this application.

Scenario 4 may be a combination of Manner 2 of obtaining the first data and Manner 1 of obtaining the second data in the embodiment shown in FIG. 2. In other words, the second chip performs interleaving processing, and the first chip performs interleaving processing on both the first codewords and the second codewords. An implementation environment of this scenario may be shown in FIG. 16, and a data transmission process is as follows.

The second chip performs outer-code encoding, namely, encoding by using FEC1 (the first FEC code type) on original data, performs outer-code interleaving on encoded data, distributes an interleaved data stream through the PMA sublayer, to obtain the plurality of pieces of first subdata, and then sends the plurality of pieces of first subdata to the first chip through the AUI. The plurality of pieces of first subdata are data that is encoded by using the first FEC code type, on which interleaving processing is performed, and that is distributed through the physical medium attachment PMA sublayer. After receiving the plurality of pieces of first subdata, the first chip performs AM lock and deskew on the plurality of pieces of first subdata, to implement an alignment operation, and then obtains the plurality of first codewords through de-interleaving. Then, the first chip performs interleaving processing, namely, outer-code interleaving, on the plurality of first codewords, to obtain the first data.

Further, after encoding the first data based on the second FEC code type, to obtain the plurality of second codewords, the first chip performs interleaving processing, namely, inner-code interleaving, on the plurality of second codewords, groups the interleaving result based on the symbol required for data modulation, and distributes the grouped data to the corresponding data lane; and obtains the second data based on data that is in each data lane. Finally, the second data is modulated and sent.

In Scenario 4, the obtaining the second data based on data that is in each data lane includes: inserting, into the data that is in each data lane, the training sequence and the pilot symbol that are required by the coherent link, to obtain the processed data, and inserting, into the processed data, the data that is for frequency adjustment, to obtain the second data.

Alternatively, the obtaining the second data based on data that is in each data lane includes: inserting, into the data that is in each data lane, the data that is for frequency adjustment, to obtain the processed data, and inserting, into the processed data, the training sequence and the pilot symbol that are required by the coherent link, to obtain the second data.

Scenario 5: The second chip performs interleaving processing, the first chip performs outer-code interleaving, but does not perform inner-code interleaving, and the first chip performs frequency adjustment and TS/pilot insertion.

Figure 17:
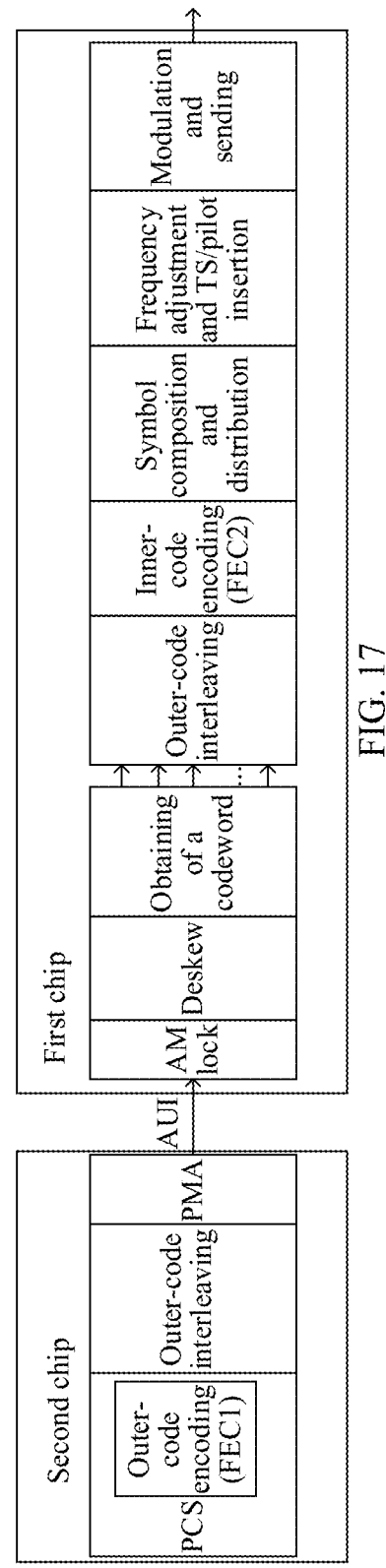
FIG. 17 is a schematic diagram of an implementation environment of another application scenario according to an embodiment of this application.

Scenario 5 may be a combination of Manner 2 of obtaining the first data and Manner 2 of obtaining the second data in the embodiment shown in FIG. 2. In other words, the second chip performs interleaving processing, and the first chip performs interleaving processing on only the first codewords, but does not perform interleaving processing on the second codewords. An implementation environment of this scenario may be shown in FIG. 17, and a data transmission process is as follows.

The second chip performs outer-code encoding, namely, encoding by using FEC1 (the first FEC code type) on original data, performs outer-code interleaving on encoded data, distributes an interleaved data stream through the PMA sublayer, to obtain the plurality of pieces of first subdata, and then sends the plurality of pieces of first subdata to the first chip through the AUI. The plurality of pieces of first subdata are data that is encoded by using the first FEC code type, on which interleaving processing is performed, and that is distributed through the physical medium attachment PMA sublayer. After receiving the plurality of pieces of first subdata, the first chip performs AM lock and deskew on the plurality of pieces of first subdata, to implement an alignment operation, and then obtains the plurality of first codewords through de-interleaving. Then, the first chip performs interleaving processing, namely, outer-code interleaving, on the plurality of first codewords, to obtain the first data.

Further, after encoding the first data based on the second FEC code type, to obtain the plurality of second codewords, the first chip groups the plurality of second codewords based on the symbol required for data modulation, and distributes grouped data to the corresponding data lane; and obtains the second data based on data that is in each data lane.

In Scenario 5, the obtaining the second data based on data that is in each data lane includes: inserting, into the data that is in each data lane, the training sequence and the pilot symbol that are required by the coherent link, to obtain the processed data, and inserting, into the processed data, the data that is for frequency adjustment, to obtain the second data.

Alternatively, the obtaining the second data based on data that is in each data lane includes: inserting, into the data that is in each data lane, the data that is for frequency adjustment, to obtain the processed data, and inserting, into the processed data, the training sequence and the pilot symbol that are required by the coherent link, to obtain the second data.

Scenario 6: The second chip performs interleaving processing, the first chip does not perform outer-code interleaving, but performs inner-code interleaving, and the first chip performs frequency adjustment and TS/pilot insertion.

Figure 18:
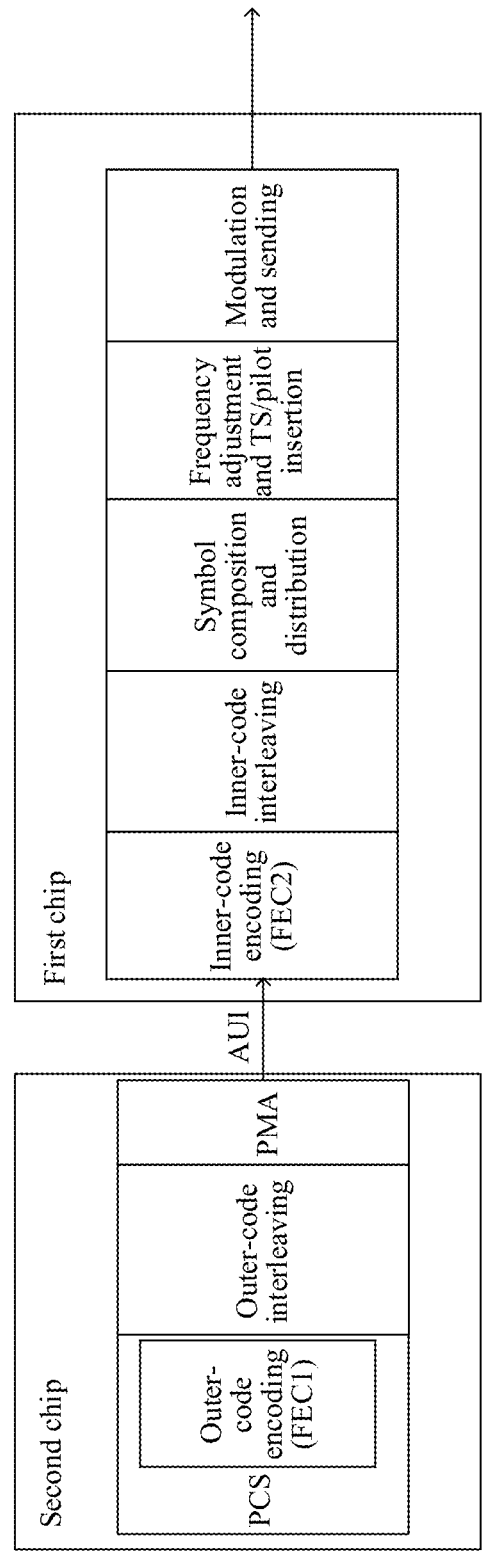
FIG. 18 is a schematic diagram of an implementation environment of another application scenario according to an embodiment of this application.

Scenario 6 may be a combination of Manner 2 of obtaining the first data and Manner 1 of obtaining the second data in the embodiment shown in FIG. 2, in other words, the second chip performs interleaving processing, and the first chip does not perform interleaving processing on the first codewords, but performs interleaving processing on the second codewords. An implementation environment of this scenario may be shown in FIG. 18, and a data transmission process is as follows.

The second chip performs outer-code encoding, namely, encoding by using FEC1 (the first FEC code type) on original data, performs outer-code interleaving on encoded data, distributes an interleaved data stream through the PMA sublayer, to obtain the plurality of pieces of first subdata, and then sends the plurality of pieces of first subdata to the first chip through the AUI. The plurality of pieces of first subdata are data that is encoded by using the first FEC code type, on which interleaving processing is performed, and that is distributed through the physical medium attachment PMA sublayer.

Further, after encoding the first subdata based on the second FEC code type, to obtain the plurality of second codewords, the first chip performs interleaving processing on the plurality of second codewords, groups the interleaving result based on the symbol required for data modulation, and distributes the grouped data to the corresponding data lane; and obtains the second data based on data that is in each data lane.

In Scenario 6, the obtaining the second data based on data that is in each data lane includes: inserting, into the data that is in each data lane, the training sequence and the pilot symbol that are required by the coherent link, to obtain the processed data, and inserting, into the processed data, the data that is for frequency adjustment, to obtain the second data.

Alternatively, the obtaining the second data based on data that is in each data lane includes: inserting, into the data that is in each data lane, the data that is for frequency adjustment, to obtain the processed data, and inserting, into the processed data, the training sequence and the pilot symbol that are required by the coherent link, to obtain the second data.

Scenario 7: The second chip performs interleaving processing, the first chip does not perform outer-code interleaving or inner-code interleaving, but the first chip performs frequency adjustment and TS/pilot insertion.

Figure 19:
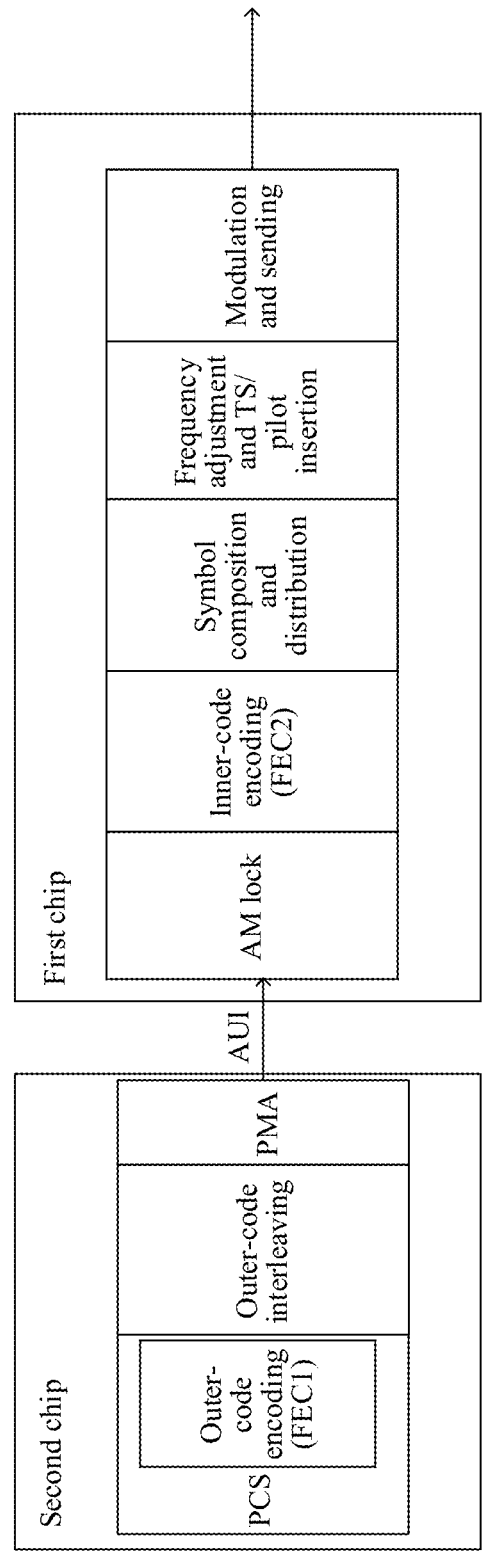
FIG. 19 is a schematic diagram of an implementation environment of another application scenario according to an embodiment of this application.

Scenario 7 may be a combination of Manner 3 of obtaining the first data and Manner 2 of obtaining the second data in the embodiment shown in FIG. 2, in other words, the second chip performs interleaving processing, and the first chip does not perform interleaving processing on the first codewords or the second codewords. An implementation environment of this scenario may be shown in FIG. 19, and a data transmission process is as follows.

The second chip performs outer-code encoding, namely, encoding by using FEC1 (the first FEC code type) on original data, performs outer-code interleaving on encoded data, distributes an interleaved data stream through the PMA sublayer, to obtain the plurality of pieces of first subdata, and then sends the plurality of pieces of first subdata to the first chip through the AUI. The plurality of pieces of first subdata are data that is encoded by using the first FEC code type, on which interleaving processing is performed, and that is distributed through the physical medium attachment PMA sublayer. After receiving the plurality of pieces of first subdata, the first chip performs AM lock on the plurality of pieces of first subdata, to implement an alignment operation, and then obtains the first data through de-interleaving.

Further, after encoding the first data based on the second FEC code type, to obtain the plurality of second codewords, the first chip groups the plurality of second codewords based on the symbol required for data modulation, and distributes the grouped data to the corresponding data lane; and obtains the second data based on data that is in each data lane.

In Scenario 7, the obtaining the second data based on data that is in each data lane includes: inserting, into the data that is in each data lane, the training sequence and the pilot symbol that are required by the coherent link, to obtain the processed data, and inserting, into the processed data, the data that is for frequency adjustment, to obtain the second data.

Alternatively, the obtaining the second data based on data that is in each data lane includes: inserting, into the data that is in each data lane, the data that is for frequency adjustment, to obtain the processed data, and inserting, into the processed data, the training sequence and the pilot symbol that are required by the coherent link, to obtain the second data.

It should be noted that, in FIG. 13 to FIG. 19 corresponding to the foregoing Scenario 1 to Scenario 7, outer-code encoding (FEC1) may be implemented inside the PCS, or may be independently implemented by an independent encoding module outside the PCS. This is not limited in embodiments of this application.

It should be further noted that the TS/pilot in embodiments of this application may be understood as a TS and/or a pilot.

Figure 20:
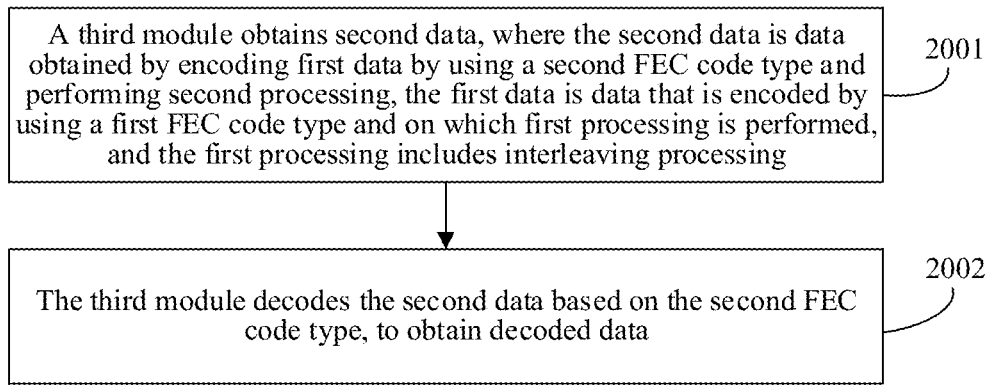
FIG. 20 is a flowchart of another data transmission method according to an embodiment of this application.

The foregoing describes the data transmission method by using the first module as an example. The following describes a data transmission process that exists after the first module sends the second data. As shown in FIG. 20, the data transmission method includes the following several operations.

Operation 2001: A third module obtains second data, where the second data is data obtained by encoding first data by using a second FEC code type and performing second processing, the first data is data that is encoded by using a first FEC code type and on which first processing is performed, and the first processing includes interleaving processing.

With reference to the implementation environment shown in FIG. 1, the third module obtains the second data sent by a first module. With reference to the embodiment shown in FIG. 2, the first module obtains the second data in a plurality of manners. Details are not described herein again in this embodiment of this application. For details, refer to the content of the embodiment shown in FIG. 2. When the first module distributes the second data to obtain a plurality of pieces of third subdata, and sends the plurality of pieces of third subdata through a plurality of logical lanes, that a third module obtains second data includes: The third module receives the plurality of pieces of third subdata, and restores the second data based on the plurality of pieces of third subdata.

Operation 2002: The third module decodes the second data based on the second FEC code type, to obtain decoded data.

Because the first module obtains the second data in a plurality of manners, there are a plurality of cases of the second data. For different cases of the second data, the third module may perform processing in different cases, including but not limited to decoding the second data based on the second FEC code type, to obtain the decoded data.

Then, the third module may further process the decoded data. A manner in which the third module processes the second data is not limited in embodiments of this application. For example, the decoded data continues to be sent to another module. Alternatively, if the second data is data obtained through outer-code interleaving and inner-code interleaving, before decoding the second data based on the second FEC code type, the third module first performs de-interleaving on the second data to obtain second codewords, then decodes the second codewords by using the second FEC code type to obtain decoded data, and performs de-interleaving on the decoded data again to obtain first codewords.

In addition, the third module may be located on a third chip, the first module is located on the first chip, and the third module receives the second data sent by the first module through the AUI.

Figure 21:
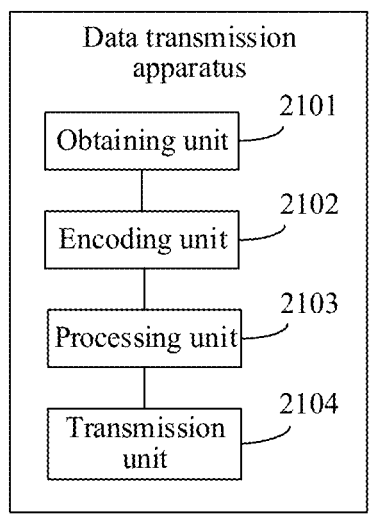
FIG. 21 is a schematic diagram of a structure of a data transmission apparatus according to an embodiment of this application.

Embodiments of this application further provide a data transmission apparatus. FIG. 21 is a schematic diagram of a structure of a data transmission apparatus according to an embodiment of this application. Based on the following plurality of units shown in FIG. 21, the data transmission apparatus shown in FIG. 21 can perform all or some operations performed by a first module. It should be understood that the apparatus may include more additional units than the shown units or omit some of the shown units. This is not limited in embodiments of this application. As shown in FIG. 21, the apparatus includes:

an obtaining unit 2101, configured to obtain first data, where the first data is data that is encoded by using a first forward error correction FEC code type and on which first processing is performed, and the first processing includes interleaving processing;

an encoding unit 2102, configured to encode the first data based on a second FEC code type, to obtain a plurality of second codewords;

a processing unit 2103, configured to perform second processing on the plurality of codewords to obtain second data; and a transmission unit 2104, configured to transmit the second data.

In an embodiment, the second processing includes inserting at least one of a training sequence and a pilot symbol required by a coherent link.

In an embodiment, at least one of the first processing and the second processing further includes inserting data that is for frequency adjustment.

In an embodiment, the obtaining unit 2101 is configured to: receive a plurality of pieces of first subdata sent by a second module, where the plurality of pieces of first subdata are data that is encoded by using the first FEC code type and that is distributed through a physical medium attachment PMA sublayer; align the plurality of pieces of first subdata to obtain a plurality of first codewords; and perform interleaving processing on the plurality of first codewords to obtain the first data.

In an embodiment, the obtaining unit 2101 is configured to: receive a plurality of pieces of first subdata sent by a second module, where the plurality of pieces of first subdata are data that is encoded by using the first FEC code type, on which interleaving processing is performed, and that is distributed through a physical medium attachment PMA sublayer; align the plurality of pieces of first subdata to obtain a plurality of first codewords; and perform interleaving processing on the plurality of first codewords to obtain the first data.

In an embodiment, the obtaining unit 2101 is configured to: align the plurality of pieces of first subdata, and perform de-interleaving on the aligned data, to obtain the plurality of first codewords based on a result of the de-interleaving; or align the plurality of pieces of first subdata, and use the aligned data as the plurality of first codewords.

In an embodiment, the obtaining unit 2101 is configured to: receive a plurality of pieces of first subdata sent by a second module, where the plurality of pieces of first subdata are data that is encoded by using the first FEC code type, on which interleaving processing is performed, and that is distributed through a physical medium attachment PMA sublayer; and align the plurality of pieces of first subdata to obtain the first data.

In an embodiment, the first module is located on a first chip, the second module is located on a second chip, and the obtaining unit 2101 is configured to receive the plurality of pieces of first subdata that are sent by the second module through a plurality of lanes of an attachment unit interface AUI.

In an embodiment, the first module is located on a first chip, and the obtaining unit 2101 is configured to: receive a plurality of pieces of first subdata that are sent by a second module through one lane of an attachment unit interface AUI, where the second module is located on a second chip, and the plurality of pieces of first subdata are data that is encoded by using the first FEC code type and that is distributed through a physical medium attachment PMA sublayer, or the plurality of pieces of first subdata are data that is encoded by using the first FEC code type, on which interleaving processing is performed, and that is distributed through a PMA sublayer; perform alignment marker AM lock on the plurality of pieces of first subdata, to obtain a plurality of first codewords; and perform interleaving processing on the plurality of first codewords, to obtain the first data.

In an embodiment, the plurality of pieces of first subdata are data that is encoded by using the first FEC code type, on which interleaving processing is performed, and that is distributed through the physical medium attachment PMA sublayer, and the obtaining unit 2101 is configured to: perform AM lock on the plurality of pieces of first subdata;

and perform de-interleaving on AM locked data, to obtain a plurality of first codewords based on a result of the de-interleaving; or perform AM lock on the plurality of pieces of first subdata, and use AM locked data as the plurality of first codewords.

In an embodiment, the first module is located on a first chip, and the obtaining unit 2101 is configured to: receive a plurality of pieces of first subdata that are sent by a second module through one lane of an attachment unit interface AUI, where the second module is located on a second chip, and the plurality of pieces of first subdata are data that is encoded by using the first FEC code type, on which interleaving processing is performed, and that is distributed through a physical medium attachment PMA sublayer; and perform alignment marker AM lock on the plurality of pieces of first subdata, and use AM locked data as the first data.

In an embodiment, the processing unit 2103 is configured to: perform interleaving processing on the plurality of second codewords, group an interleaving result based on a symbol or at least one bit required for data modulation, and distribute grouped data to a corresponding data lane; and obtain the second data based on data that is in each data lane.

In an embodiment, the processing unit 2103 is configured to: group the plurality of second codewords based on the symbol or the at least one bit required for data modulation, and distribute grouped data to a corresponding data lane; and obtain the second data based on data that is in each data lane.

In an embodiment, the processing unit 2103 is configured to: insert, into the data that is in each data lane, a training sequence and a pilot symbol that are required by a coherent link, to obtain processed data, and insert, into the processed data, the data that is for frequency adjustment, to obtain the second data.

In an embodiment, the processing unit 2103 is configured to: insert, into the data that is in each data lane, the data that is for frequency adjustment, to obtain processed data, and insert, into the processed data, a training sequence and a pilot symbol that are required by a coherent link, to obtain the second data.

In an embodiment, the obtaining unit 2101 is configured to: perform direct interleaving on the plurality of first codewords, where a quantity of interleaved codewords is a quantity of codewords participating in the interleaving; perform staggered interleaving on the plurality of first codewords at a reference interval, where a quantity of interleaved codewords is a quantity of codewords participating in the interleaving, and the reference interval is a quantity of code blocks by which two codewords are staggered; or perform convolutional interleaving on the plurality of first codewords, where a quantity of interleaved codewords is a quantity of codewords participating in the interleaving.

In an embodiment, the processing unit 2103 is configured to: interleave second codewords that are in the plurality of second codewords and that are from a same encoder; interleave a plurality of second codewords that are in the plurality of second codewords and that are from a plurality of encoders; or interleave second codewords that are in the plurality of second codewords and that are from a same encoder, and further interleave a plurality of data streams that are obtained through interleaving and that are from a plurality of encoders.

In an embodiment, the encoding unit 2102 is configured to: distribute the first data to obtain a plurality of pieces of second subdata, and separately encode the plurality of pieces of second subdata based on the second FEC code type, to obtain the plurality of second codewords.

In an embodiment, the encoding unit 2102 is configured to: distribute the first data through a physical coding sublayer PCS lane, to obtain the plurality of pieces of second subdata; or distribute the first data through a physical medium attachment PMA sublayer, to obtain the plurality of pieces of second subdata.

In an embodiment, the transmission unit 2104 is configured to: distribute the second data to obtain a plurality of pieces of third subdata, and send the plurality of pieces of third subdata through a plurality of logical lanes.

Figure 22:
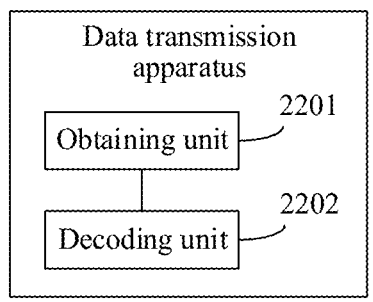
FIG. 22 is a schematic diagram of a structure of another data transmission apparatus according to an embodiment of this application.

FIG. 22 is a schematic diagram of a structure of a data transmission apparatus according to an embodiment of this application. Based on the following plurality of units shown in FIG. 22, the data transmission apparatus shown in FIG. 22 can perform all or some operations performed by a third module. It should be understood that the apparatus may include more additional units than the shown units or omit some of the shown units. This is not limited in embodiments of this application. As shown in FIG. 22, the apparatus includes:

an obtaining unit 2201, configured to obtain second data, where the second data is data obtained by encoding first data by using a second forward error correction FEC code type and performing second processing, the first data is data that is encoded by using a first FEC code type and on which first processing is performed, and the first processing includes interleaving processing; and a decoding unit 2202, configured to decode the second data based on the second FEC code type, to obtain decoded data.

In an embodiment, the obtaining unit 2201 is configured to: receive a plurality of pieces of third subdata, and restore the second data based on the plurality of pieces of third subdata.

It should be understood that, when the apparatuses provided in FIG. 21 and FIG. 22 implement functions of the apparatuses, division into the foregoing functional modules is merely used as an example for description. In actual application, the foregoing functions may be allocated to different functional units for implementation based on a requirement. That is, an inner structure of a device is divided into different functional units, to implement all or some of the functions described above. In addition, the apparatuses provided in the foregoing embodiments and the method embodiments pertain to the same concept. For a specific implementation process of the apparatus, refer to the method embodiments. Details are not described herein again.

An embodiment of this application provides a data transmission device. The device includes a processor. The processor is coupled to a memory, the memory stores at least one program instruction or code, and the at least one program instruction or code is loaded and executed by the processor, so that the data transmission device implements the methods in the foregoing method embodiments.

Figure 23:
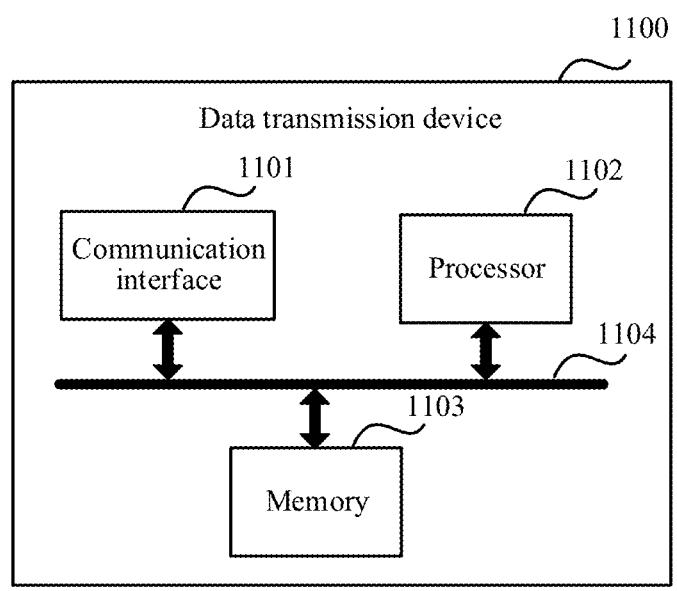
FIG. 23 is a schematic diagram of a structure of another data transmission device according to an embodiment of this application.

FIG. 23 is a schematic diagram of a structure of a data transmission device 1100 according to an embodiment of this application. The data transmission device 1100 is a transmit side/receive side device. The data transmission device 1100 shown in FIG. 23 is configured to perform operations related to the data transmission method shown in FIG. 2. The data transmission device 1100 is, for example, a network device such as a switch or a router, or another device (such as a server or a PC) including a chip concatenated mode. A hardware structure of the data transmission device 1100 includes a communication interface 1101 and a processor 1102. In an embodiment, the communication interface 1101 and the processor 1102 are connected through a bus 1104. The communication interface 1101 is configured to obtain first data and transmit second data. The processor may store instructions or program code, and invoke the instructions or the program code to perform a function performed by the first module or a function performed by the third module. In an embodiment, the network device further includes a memory 1103. The memory 1103 stores instructions or program code. The processor 1102 is configured to invoke the instructions or the program code in the memory 1103, so that the network device performs related processing operations of the first module in the foregoing method embodiments. In a specific embodiment, the data transmission device 1100 in embodiments of this application may include the first module in the foregoing method embodiments. The processor 1102 in the data transmission device 1100 reads instructions or program code in the memory 1103, so that the data transmission device 1100 shown in FIG. 23 can perform all or some operations performed by the first module.

In a specific embodiment, the data transmission device 1100 in embodiments of this application includes the third module in the foregoing method embodiments. The processor 1102 in the data transmission device 1100 reads instructions or program code in the memory 1103, so that the data transmission device 1100 shown in FIG. 23 can perform all or some operations performed by the third module.

For example, the processor 1102 is, for example, a general-purpose central processing unit (CPU), a digital signal processor (DSP), a network processor (NP), a graphics processing unit (GPU), a neural-network processing unit (NPU), a data processing unit (DPU), a microprocessor, or one or more integrated circuits configured to implement the solutions of this application. For example, the processor 1102 includes an application-specific integrated circuit (ASIC), a programmable logic device (PLD) or another programmable logic device, a transistor logic device, a hardware component, or any combination thereof. The PLD is, for example, a complex programmable logic device (CPLD), a field-programmable gate array (FPGA), generic array logic (GAL), or any combination thereof. The processor may implement or execute various logical blocks, modules, and circuits described with reference to content disclosed in embodiments of the present application. Alternatively, the processor may be a combination of processors implementing a computing function, for example, including a combination of one or more microprocessors, or a combination of a DSP and a microprocessor.

In an embodiment, the data transmission device 1100 further includes a bus. The bus is used for information transmission between components of the data transmission device 1100. The bus may be a peripheral component interconnect (PCI) bus, an extended industry standard architecture (EISA) bus, or the like. Buses may be classified into an address bus, a data bus, a control bus, and the like. For ease of representation, only one thick line is used to represent the bus in FIG. 23, but this does not mean that there is only one bus or only one type of bus. Components of the data transmission device 1100 in FIG. 23 may be connected in another manner in addition to being connected through a bus. A connection manner of the components is not limited in embodiments of the present application.

For example, the memory 1103 is a read-only memory (ROM) or another type of static storage device capable of storing static information and instructions, or a random access memory (RAM) or another type of dynamic storage device capable of storing information and instructions, or is an electrically erasable programmable read-only memory (EEPROM), a compact disc read-only memory (CD-ROM) or other compact disc storage, optical disc storage (including a compact disc, a laser disc, an optical disc, a digital versatile disc, a Blu-ray disc, and the like), a magnetic disk storage medium or another magnetic storage device, or any other medium capable of carrying or storing expected program code in an instruction form or a data structure form and capable of being accessed by a computer. However, the memory 1103 is not limited thereto. For example, the memory 1103 exists independently, and is connected to the processor 1102 through a bus. Alternatively, the memory 1103 may be integrated into the processor 1102.

The communication interface 1101 is any transceiver-type apparatus, and is configured to communicate with another device or a communication network. The communication network may be the Ethernet, a radio access network (RAN), a wireless local area network (WLAN), or the like. The communication interface 1101 may include a wired communication interface, and may further include a wireless communication interface. Specifically, the communication interface 1101 may be an Ethernet interface, a fast Ethernet (FE) interface, a gigabit Ethernet (GE) interface, an asynchronous transfer mode (ATM) interface, a wireless local area network (WLAN) interface, a cellular network communication interface, or a combination thereof. The Ethernet interface may be an optical interface, an electrical interface, or a combination thereof. In embodiments of this application, the communication interface 1101 may be used by the data transmission device 1100 to communicate with another device.

In a specific implementation, in an embodiment, the processor 1102 may include one or more CPUs. Each of the processors may be a single-CPU processor, or may be a multi-CPU processor. The processor herein may be one or more devices, circuits, and/or processing cores configured to process data (such as computer program instructions).

In a specific implementation, in an embodiment, the data transmission device 1100 may include a plurality of processors. Each of the processors may be a single-CPU processor, or may be a multi-CPU processor. The processor herein may be one or more devices, circuits, and/or processing cores configured to process data (such as computer program instructions).

In specific implementation, in an embodiment, the data transmission device 1100 may further include an output device and an input device. The output device communicates with the processor 1102, and may display information in a plurality of manners. For example, the output device may be a liquid crystal display (LCD), a light-emitting diode (LED) display device, a cathode ray tube (CRT) display device, or a projector. The input device communicates with the processor 1102, and may receive an input by a user in a plurality of manners. For example, the input device may be a mouse, a keyboard, a touchscreen device, or a sensing device.

In some embodiments, the memory 1103 is configured to store program code for performing the solutions of this application, and the processor 1102 may execute the program code stored in the memory 1103. In other words, the data transmission device 1100 may implement, via the processor 1102 and the program code in the memory 1103, the data transmission methods provided in the method embodiments. The program code may include one or more software modules. In an embodiment, the processor 1102 may store program code or instructions for performing the solutions of this application.

In a specific embodiment, the data transmission device 1100 in embodiments of this application may include the first module in the foregoing method embodiments. The processor 1102 in the data transmission device 1100 reads program code in the memory 1103 or program code or instructions stored in the processor 1102, so that the data transmission device 1100 shown in FIG. 23 can perform all or some operations performed by the first module.

In a specific embodiment, the data transmission device 1100 in embodiments of this application may include the third module in the foregoing method embodiments. The processor 1102 in the data transmission device 1100 reads program code in the memory 1103 or program code or instructions stored in the processor 1102, so that the data transmission device 1100 shown in FIG. 23 can perform all or some operations performed by the third module.

The data transmission device 1100 may further correspond to the apparatuses shown in FIG. 21 and FIG. 22. Each functional unit in the apparatuses shown in FIG. 21 and FIG. 22 is implemented by using software of the data transmission device 1100. In other words, the functional units included in the apparatuses shown in FIG. 21 and FIG. 22 are generated after the processor 1102 of the data transmission device 1100 reads the program code stored in the memory 1103.

The operations of the data transmission method shown in FIG. 2 are implemented by using an integrated logic circuit of hardware in the processor of the data transmission device 1100 or by using instructions in a form of software. The operations of the method disclosed with reference to embodiments of this application may be directly performed by a hardware processor, or may be performed by using a combination of hardware in the processor and a software module. A software module may be located on a mature storage medium in the art, such as a random access memory, a flash memory, a read-only memory, a programmable read-only memory, an electrically erasable programmable memory, or a register. The storage medium is located on the memory, and the processor reads information in the memory and performs the operations in the foregoing methods in combination with the hardware in the processor. To avoid repetition, details are not described herein again.

An embodiment of this application further provides a data transmission system. The system includes a first data transmission device and a second data transmission device. The first data transmission device is configured to perform the method performed by the first module shown in FIG. 2, and the second data transmission device is configured to perform the method performed by the third module shown in FIG. 2.

For respective functions of the first data transmission device and the second data transmission device in the system, refer to related descriptions shown in FIG. 2. Details are not described herein again.

It should be understood that the processor may be a central processing unit (CPU), or may be another general-purpose processor, a digital signal processor (DSP), an application-specific integrated circuit (ASIC), a field-programmable gate array (FPGA) or another programmable logic device, a discrete gate or a transistor logic device, a discrete hardware component, or the like. The general-purpose processor may be a microprocessor or any conventional processor. It should be noted that the processor may be a processor that supports an advanced reduced instruction set computing machine (ARM) architecture.

Further, in an optional embodiment, the memory may include a read-only memory and a random access memory, and provide instructions and data for the processor. The memory may further include a nonvolatile random access memory. For example, the memory may further store information of a device type.

The memory may be a volatile memory or a nonvolatile memory, or may include both a volatile memory and a nonvolatile memory. The nonvolatile memory may be a read-only memory (ROM), a programmable read-only memory (PROM), an erasable programmable read-only memory (EPROM), an electrically erasable programmable read-only memory (EEPROM), or a flash memory. The volatile memory may be a random access memory (RAM), used as an external cache. By way of example, and not limitation, many forms of RAMs may be used, for example, a static random access memory (SRAM), a dynamic random access memory (DRAM), a synchronous dynamic random access memory (SDRAM), a double data rate synchronous dynamic random access memory (DDR SDRAM), an enhanced synchronous dynamic random access memory (ESDRAM), a synchlink dynamic random access memory (SLDRAM), and a direct rambus random access memory (DR RAM).

A computer-readable storage medium is further provided. The storage medium stores at least one program instruction or code. When the program instruction or code is loaded and executed by a processor, a computer is enabled to implement the data transmission method shown in FIG. 2.

This application provides a computer program. When the computer program is executed by a computer, a processor or the computer is enabled to perform corresponding operations and/or procedures in the foregoing method embodiments.

A chip is provided, includes a processor, and is configured to: invoke, from a memory, instructions stored in the memory and run the instructions, so that a device on which the chip is installed performs the methods in the foregoing aspects.

Another chip is provided. The chip includes: an input interface, an output interface, a processor, and a memory. The input interface, the output interface, the processor, and the memory are connected to each other through an internal connection path. The processor is configured to execute code that is in the memory. When the code is executed, the processor is configured to perform the methods in the foregoing aspects.

A device is provided, and includes the chip according to any one of the foregoing solutions.

A device is provided, and includes the first chip according to any one of the foregoing solutions and/or the third chip according to any one of the foregoing solutions.

In some embodiments, in FIG. 13 to FIG. 19, the second chip may be a transmitting-side device, for example, a physical (PHY) layer chip in a router, a switch, or a server, and the first chip may be an interface of a receiving-side device, for example, a chip or a CDR/retimer chip in an optical module. The third chip may be an interface of the receiving-side device, for example, a chip or a CDR/retimer chip in an optical module. The PHY chip may be a chip located on a board of a computing device, and the chip may be one or any combination of a CPU, a network processor (NP), a neural network processing unit (NPU), a field programmable logic gate array (FPGA), a programmable logic controller (PLC), and the like.

In some embodiments, the first chip and the second chip communicate with each other through an AUI. In some embodiments, the third chip and the first chip communicate with each other through an AUI.

All or some of the foregoing embodiments may be implemented by using software, hardware, firmware, or any combination thereof. When software is used to implement embodiments, all or a part of embodiments may be implemented in a form of a computer program product. The computer program product includes one or more computer instructions. When the computer program instructions are loaded and executed on a computer, the procedure or functions according to this application are all or partially generated. The computer may be a general-purpose computer, a dedicated computer, a computer network, or other programmable apparatuses. The computer instructions may be stored in a computer-readable storage medium, or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line) or wireless (for example, infrared, radio, or microwave) manner. The computer-readable storage medium may be any usable medium accessible by the computer, or a data storage device, for example, a server or a data center, integrating one or more usable media. The usable medium may be a magnetic medium (for example, a floppy disk, a hard disk, or a magnetic tape), an optical medium (for example, a DVD), a semiconductor medium (for example, a solid-state drive solid-state drive), or the like.

In the foregoing specific implementations, the objectives, technical solutions, and beneficial effects of this application are further described in detail. It should be understood that the foregoing descriptions are merely specific implementations of this application, but are not intended to limit the protection scope of this application. Any modification, equivalent replacement, improvement, or the like made based on the technical solutions of this application shall fall within the protection scope of this application.

A person of ordinary skill in the art may be aware that, with reference to embodiments disclosed in this specification, the method operations and the modules can be implemented by using software, hardware, firmware, or any combination thereof. To clearly describe interchangeability between the hardware and the software, the operations and composition of each embodiment have generally described above based on functions. Whether the functions are performed by hardware or software depends on particular applications and design constraint conditions of the technical solutions. A person of ordinary skill in the art may use different methods to implement the described functions for each particular application, but it should not be considered that the implementation goes beyond the scope of this application.

A person of ordinary skill in the art may understand that all or some of the operations of embodiments may be implemented by hardware or a program instructing related hardware. The program may be stored in a computer-readable storage medium. The storage medium may include: a read-only memory, a magnetic disk, or an optical disc.

When software is used to implement embodiments, all or a part of embodiments may be implemented in a form of a computer program product. The computer program product includes one or more computer program instructions. For example, the methods in embodiments of this application may be described in a context of machine-executable instructions. The machine-executable instructions are included in, for example, a program module executed in a device on a real or virtual processor of a target. Usually, the program module includes a routine, a program, a library, an object, a class, a component, a data structure, and the like, and executes a specific task or implements a specific abstract data structure. In various embodiments, functions of program modules may be combined or split between the described program modules. The machine-executable instructions for the program module may be executed locally or within a distributed device. In the distributed device, the program module may be located on both a local storage medium and a remote storage medium.

Computer program code used to implement the method in embodiments of this application may be written in one or more programming languages. The computer program code may be provided for a processor of a general-purpose computer, a dedicated computer, or another programmable data processing apparatus, so that when the program code is executed by the computer or the another programmable data processing apparatus, functions/operations specified in the flowcharts and/or block diagrams are implemented. The program code may be executed all on a computer, partially on a computer, as an independent software package, partially on a computer and partially on a remote computer, or all on a remote computer or server.

In a context of embodiments of this application, the computer program code or related data may be carried by any appropriate carrier, so that a device, an apparatus, or a processor can perform various processing and operations described above. For example, the carrier includes a signal, a computer-readable medium, and the like.

For example, the signal may include propagating signals in electrical, optical, radio, sound, or other forms, such as carrier waves and infrared signals.

The machine-readable medium may be any tangible medium that includes or stores a program used for or related to an instruction execution system, an apparatus, or a device. The machine-readable medium may be a machine-readable signal medium or a machine-readable storage medium. The machine-readable medium may include but is not limited to an electronic, magnetic, optical, electromagnetic, infrared, or semiconductor system, apparatus, or device, or any appropriate combination thereof. More detailed examples of the machine-readable storage medium include an electrical connection with one or more wires, a portable computer disk, a hard disk, a random access memory (RAM), a read-only memory (ROM), an erasable programmable read-only memory (EPROM or a flash memory), an optical storage device, a magnetic storage device, or any appropriate combination thereof.

It may be clearly understood by a person skilled in the art that, for convenient and brief description, for a detailed working process of the foregoing system, devices, and modules, refer to a corresponding process in the foregoing method embodiments. Details are not described herein.

In the several embodiments provided in this application, it should be understood that the disclosed system, devices, and methods may be implemented in other manners. For example, the described device embodiments are merely examples. For example, the module division is merely logical function division and may be other division during actual implementation. For example, a plurality of modules or components may be combined or integrated into another system, or some features may be ignored or not performed. In addition, the displayed or discussed mutual couplings or direct couplings or communication connections may be implemented through some interfaces, and the indirect couplings or communication connections between the devices or modules may be electrical connections, mechanical connections, or connections in other forms.

The modules described as separate parts may or may not be physically separate, and parts displayed as modules may or may not be physical modules, may be located on one position, or may be distributed on a plurality of network modules. Some or all of the modules may be selected based on actual requirements to achieve the objectives of the solutions in embodiments of this application.

In addition, functional modules in embodiments of this application may be integrated into one processing module, or each of the modules may exist alone physically, or two or more modules may be integrated into one module. The integrated module may be implemented in a form of hardware, or may be implemented in a form of a software functional module.

When the integrated module is implemented in the form of a software functional module and sold or used as an independent product, the integrated module may be stored in a computer-readable storage medium. Based on such an understanding, the technical solutions of this application essentially, or the part contributing to a conventional technology, or all or some of the technical solutions may be implemented in the form of a software product. The computer software product is stored in a storage medium and includes several instructions to enable a computer device (which may be a personal computer, a server, a network device, or the like) to perform all or some of the operations of the methods in embodiments of this application. The foregoing storage medium includes any medium that can store program code, such as a USB flash drive, a removable hard disk, a read-only memory (ROM), a random access memory (RAM), a magnetic disk, or an optical disc.

In this application, the terms "first", "second", and the like are used to distinguish between same or similar items whose effects and functions are basically the same. It should be understood that there is no logical or time-sequence dependency among "first", "second", and "$n^{th}$", and a quantity and an execution sequence are not limited. It should also be understood that although the terms such as "first" and "second" are used in the following descriptions to describe various elements, these elements should not be limited by the terms. These terms are merely used to distinguish one element from another element. For example, without departing from the scope of various examples, a first network device may be referred to as a second network device. Similarly, a second network device may be referred to as a first network device. Both the first network device and the second network device may be network devices, and in some cases, may be separate and different network devices.

It should be further understood that sequence numbers of processes do not mean execution sequences in embodiments of this application. The execution sequences of the processes should be determined based on functions and internal logic of the processes, and should not be construed as any limitation on the implementation processes of embodiments of this application.

In this application, the term "at least one" means one or more, and the term "a plurality of" means two or more. For example, a plurality of second packets mean two or more second packets. The terms "system" and "network" may be used interchangeably in this specification.

It should be understood that the terms used in the descriptions of various examples in this specification are merely intended to describe specific examples, but are not intended to constitute a limitation. The terms "one" ("a" and "an") and "the" of singular forms used in the descriptions of various examples and the appended claims are also intended to include plural forms, unless otherwise specified in the context clearly.

It should be further understood that the term "include" (or "includes", "including", "comprises", and/or "comprising"), when being used in this specification, specifies the presence of stated features, integers, steps, operations, elements, and/or components, but does not preclude the presence or addition of one or more other features, integers, steps, operations, elements, components, and/or groups thereof.

It should be further understood that the term "if" may be interpreted as a meaning "when" ("when" or "upon"), "in response to determining", or "in response to detecting". Similarly, based on the context, the phrase "if it is determined that" or "if (a stated condition or event) is detected" may be interpreted as a meaning of "when it is determined that" or "in response to determining" or "when (a stated condition or event) is detected" or "in response to detecting (a stated condition or event)".

It should be understood that determining B based on A does not mean that B is determined only based on A, but B may be determined based on A and/or other information.

It should further be understood that "one embodiment", "an embodiment", or "an embodiment" mentioned throughout this specification means that particular features, structures, or characteristics related to embodiments or implementations are included in at least one embodiment of this application. Therefore, "in one embodiment", "in an embodiment", or "in an embodiment" appearing throughout this specification does not necessarily mean a same embodiment. In addition, these particular features, structures, or characteristics may be combined in one or more embodiments in any appropriate manner.

What is claimed is:

1. A data transmission method, wherein the method comprises:
    obtaining, by a first circuit, first data sent by a second circuit, wherein the first data is data that is encoded by using a first forward error correction (FEC) code type and on which first processing is performed, the first processing comprises first outer-code interleaving processing, and the first circuit communicates with the second circuit by using an attachment unit interface (AUI);
    performing, by the first circuit, third processing on the first data to obtain encoded data, wherein the third processing comprises second outer-code interleaving processing and inner-code encoding processing, and the inner-code encoding processing is encoding processing implemented according to a second FEC code type; and;
    performing, by the first circuit, second processing on the encoded data to obtain second data; and;
    transmitting, by the first circuit, the second data.

2. The method according to claim 1, wherein the second processing comprises inserting at least one of a training sequence and a pilot symbol.

3. The method of claim 1, wherein the second processing comprises grouping the encoded data based on a symbol required for modulation.

4. The method according to claim 3, wherein the inner-code encoding processing is implemented by multiple inner-code encoders, the encoded data comprises multiple channels of data, and the multiple channels of data are in a one-to-one correspondence with the multiple inner-code encoders; and the grouping the encoded data based on a symbol required for modulation comprises:

grouping the multiple channels of data based on symbols required for modulation.

5. The method according to claim 1, wherein at least one of the first processing and the second processing further comprises inserting data for frequency adjustment.

6. The method according to claim 1, wherein the second outer-code interleaving processing comprises convolutional interleaving.

7. The method according to claim 6, wherein the convolutional interleaving comprises:
distributing the first data to multiple registers having delays of different lengths in a polling manner based on p-bit data block, wherein the distributed first data with unequal delays from the multiple registers are aggregated into a same data stream to form an interleaved bit stream, and one register in the multiple registers does not delay the bit stream.

8. The method according to claim 1, wherein the second FEC code type is a Bose-Chaudhuri-Hocquenghem (BCH) code.

9. The method according to claim 1, wherein the obtaining, by a first circuit, first data sent by a second circuit comprises:
obtaining, by the first circuit, a plurality of pieces of first subdata sent by the second circuit, wherein the first data comprises the plurality of pieces of first subdata, and the plurality of pieces of first subdata are data that is encoded by using the first FEC code type and distributed by using a physical medium attachment (PMA) sublayer.

10. The method according to claim 9, wherein the obtaining, by a first circuit, first data sent by a second circuit comprises:
obtaining, by the first circuit, the plurality of pieces of first subdata sent by the second circuit by using a plurality of lanes of the AUI.

11. The method according to claim 1, wherein the third processing further comprises deskew processing.

12. The method according to claim 1, wherein the third processing further comprises alignment marker (AM) locking processing.

13. The method according to claims 1, wherein the first FEC code type is used in outer-code encoding processing of concatenated encoding, and the second FEC code type is used in the inner-code encoding processing of concatenated encoding.

14. The method according to claim 1, wherein the first circuit is a chip in an optical module, and the second circuit is a physical layer (PHY) chip.

15. A data transmission apparatus, wherein the apparatus comprises a first circuit, and the first circuit is configured to:
obtain first data sent by a second circuit, wherein the first data is data that is encoded by using a first forward error correction (FEC) code type and on which first processing is performed, the first processing comprises first outer-code interleaving processing, and the first circuit communicates with the second circuit by using an attachment unit interface (AUI);
perform third processing on the first data to obtain encoded data, wherein the third processing comprises second outer-code interleaving processing and inner-code encoding processing, and the inner-code encoding processing is encoding processing implemented according to a second FEC code type; and;
perform second processing on the encoded data to obtain second data; and
transmit the second data.

16. The apparatus according to claim 15, wherein the second processing comprises inserting at least one of a training sequence and a pilot symbol.

17. The apparatus according to claim 15, wherein the second processing comprises grouping the encoded data based on a symbol required for modulation.

18. The apparatus according to claim 17, wherein the inner-code encoding processing is implemented by multiple inner-code encoders, the encoded data comprises multiple channels of data, and the multiple channels of data are in a one-to-one correspondence with the multiple inner-code encoders; and the grouping the encoded data based on a symbol required for modulation comprises:
grouping the multiple channels of data based on symbols required for modulation.

19. The apparatus according to claim 15, wherein at least one of the first processing and the second processing further comprises inserting data for frequency adjustment.

20. The apparatus according to claim 15, wherein the second outer-code interleaving processing comprises convolutional interleaving.

21. The apparatus according to claim 20, wherein the convolutional interleaving comprises:
Distributing the first data to multiple registers having delays of different lengths in a polling manner based on p-bit data block, wherein the distributed first data with unequal delays from the multiple registers are aggregated into a same data stream to form an interleaved bit stream, and one register in the multiple registers does not delay the bit stream.

22. The apparatus according to claim 15, wherein the first circuit is further configured to:
obtain a plurality of pieces of first subdata sent by the second circuit, wherein the first data comprises the plurality of pieces of first subdata, and the plurality of pieces of first subdata are data that is encoded by using the first FEC code type and distributed by using a physical medium attachment (PMA) sublayer.

23. The apparatus according to claim 22, wherein the first circuit is further configured to:
obtain the plurality of pieces of first subdata sent by the second circuit by using a plurality of lanes of the AUI.

24. The apparatus according to claim 15, wherein the third processing further comprises deskew processing.

25. The apparatus according to claim 15, wherein the third processing further comprises alignment marker (AM) locking processing.

26. The apparatus according to claim 15, wherein the first FEC code type is used in outer-code encoding processing of concatenated encoding, and the second FEC code type is used in the inner-code encoding processing of concatenated encoding.

27. The apparatus according to claim 15, wherein the first circuit is a chip in an optical module, and the second circuit is a physical layer (PHY) chip.

28. A data transmission system, wherein the data transmission system comprises a first circuit and a second circuit, the first circuit is configured to:
obtain first data sent by a second circuit, wherein the first data is data that is encoded by using a first forward error correction (FEC) code type and on which first processing is performed, the first processing comprises first outer-code interleaving processing, and the first circuit communicates with the second circuit by using an attachment unit interface (AUI);

perform third processing on the first data to obtain encoded data, wherein the third processing comprises second outer-code interleaving processing and inner-code encoding processing, and the inner-code encoding processing is encoding processing implemented according to a second FEC code type; and;

perform second processing on the encoded data to obtain second data; and;

transmit the second data; and the second circuit is configured to send first data to the first circuit.

* * * * *